US010793947B2

(12) United States Patent
Chen et al.

(10) Patent No.: US 10,793,947 B2
(45) Date of Patent: Oct. 6, 2020

(54) ALLOYS OF CO TO REDUCE STRESS

(71) Applicant: Entegris, Inc., Billerica, MA (US)

(72) Inventors: Philip S. H. Chen, Bethel, CT (US);
Bryan C. Hendrix, Danbury, CT (US);
Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 269 days.

(21) Appl. No.: 15/674,156

(22) Filed: Aug. 10, 2017

(65) Prior Publication Data
US 2018/0044788 A1    Feb. 15, 2018

Related U.S. Application Data

(60) Provisional application No. 62/374,860, filed on Aug. 14, 2016.

(51) Int. Cl.
C23C 16/16    (2006.01)
C23C 16/30    (2006.01)
(Continued)

(52) U.S. Cl.
CPC .............. C23C 16/16 (2013.01); B32B 15/04 (2013.01); C07F 15/06 (2013.01); C22C 19/07 (2013.01);
(Continued)

(58) Field of Classification Search
None
See application file for complete search history.

(56) References Cited

U.S. PATENT DOCUMENTS 3,857,683 A     12/1974 Castonguay
6,984,591 B1 *  1/2006 Buchanan ......... C23C 16/45531
                                                  438/778
(Continued)

FOREIGN PATENT DOCUMENTS

JP    2011208265 A  * 10/2011
KR    20110059741 A    6/2011
(Continued)

OTHER PUBLICATIONS

Machine translation of JP 2011208265A. (Translated Aug. 26, 2019) (Year: 2011).*

Primary Examiner — David Sample
Assistant Examiner — Elizabeth Collister
(74) Attorney, Agent, or Firm — Entegris, Inc.

(57) ABSTRACT

A deposited cobalt composition is described, including cobalt and one or more alloy component that is effective in combination with cobalt to enhance adhesion to a substrate when exposed on the substrate to variable temperature and/or delaminative force conditions, as compared to corresponding elemental cobalt, wherein the one or more alloy component is selected from the group consisting of boron, phosphorous, tin, antimony, indium, and gold. Such deposited cobalt composition may be employed for metallization in semiconductor devices and device precursor structures, flat-panel displays, and solar panels, and provides highly adherent metallization when the metallized substrate is subjected to thermal cycling and/or chemical mechanical planarization operations in the manufacturing of the semiconductor, flat-panel display, or solar panel product.

17 Claims, 35 Drawing Sheets

(51) Int. Cl.
    *C23C 16/02*         (2006.01)
    *C23C 16/18*         (2006.01)
    *C07F 15/06*         (2006.01)
    *B32B 15/04*         (2006.01)
    *C22C 19/07*         (2006.01)
    *H01L 21/768*       (2006.01)

(52) U.S. Cl.
    CPC .......... *C23C 16/0281* (2013.01); *C23C 16/18* (2013.01); *C23C 16/30* (2013.01); *B32B 2255/06* (2013.01); *B32B 2255/205* (2013.01); *B32B 2457/14* (2013.01); *H01L 21/76876* (2013.01); *H01L 21/76879* (2013.01)

(56) References Cited

U.S. PATENT DOCUMENTS

| | | |
|---|---|---|
| 2005/0170201 A1 | 8/2005 | Ware et al. |
| 2009/0053426 A1* | 2/2009 | Lu .................. C23C 16/16 427/540 |
| 2009/0208637 A1 | 8/2009 | Chen et al. |
| 2014/0183738 A1* | 7/2014 | Jezewski ............ H01L 23/485 257/751 |
| 2015/0246941 A1 | 9/2015 | Peters |
| 2015/0255333 A1 | 9/2015 | Lu et al. |
| 2016/0093538 A1* | 3/2016 | Wakatsuki ........ H01L 21/82387 438/660 |
| 2016/0351442 A1 | 12/2016 | Nishizawa |

FOREIGN PATENT DOCUMENTS

| | | |
|---|---|---|
| TW | 201442184 A | 11/2014 |
| WO | 2015/157004 A1 | 10/2015 |

\* cited by examiner

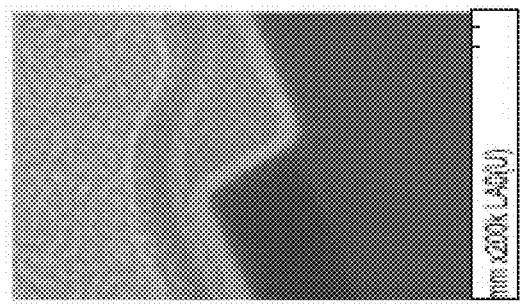
Figure 23
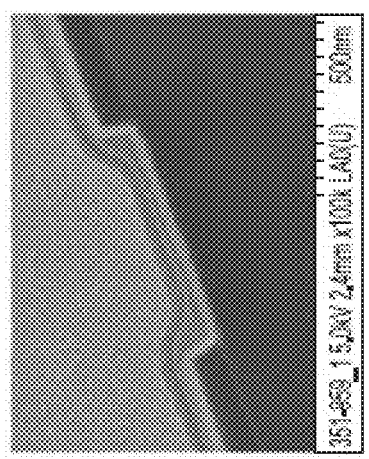
Figure 22
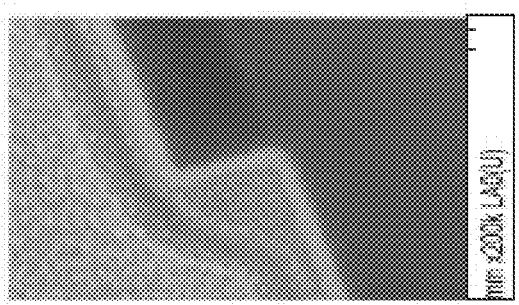
Figure 24
Figure 26
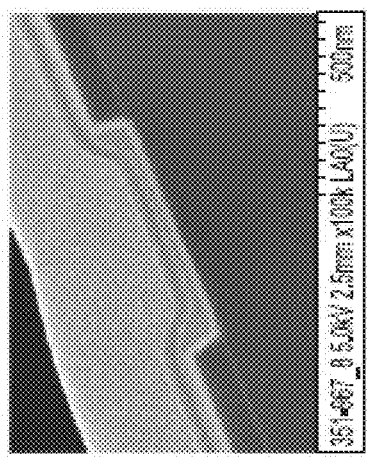
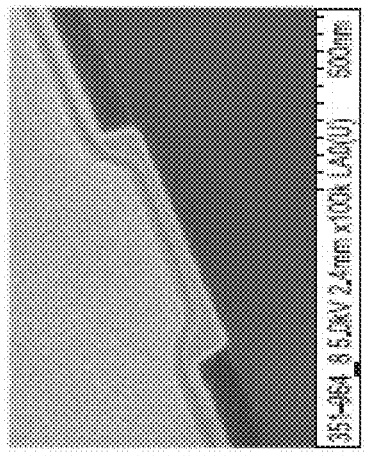
Figure 25

ALLOYS OF Co TO REDUCE STRESS

CROSS-REFERENCE TO RELATED APPLICATIONS

This application claims the benefit of and priority to U.S. Provisional Application Ser. No. 62/374,860, filed Aug. 14, 2016, entitled "ALLOYS OF Co TO REDUCE STRESS" which application is incorporated herein by reference in its entirety.

FIELD

The present disclosure relates to cobalt alloys, and products such as semiconductor devices, solar panels, and flat-panel displays, and precursor structures thereof, which comprise such cobalt alloys, as well as to associated methods for making and using such alloys.

DESCRIPTION OF THE RELATED ART

Cobalt is widely used in the manufacture of a wide variety of products, including semiconductor devices, solar panels, and flat-panel displays, and precursor structures thereof, in contacts, interconnects, metal leads, substrates, and a wide variety of thin-film components of integrated circuitry.

Although cobalt exhibits highly advantageous performance characteristics in such applications, cobalt has the deficiency that it tends to lose adhesion during thermal cycling and/or chemical mechanical planarization operations in the manufacture of the aforementioned products and precursor structures thereof.

SUMMARY

The present disclosure relates to cobalt compositions comprising cobalt alloys that display enhanced delamination resistance, in relation to elemental cobalt compositions, for applications such as semiconductor devices and device precursor structures, flat-panel displays, and solar panels.

In one aspect, the disclosure relates to a vapor deposited cobalt composition, comprising cobalt and one or more alloy component that is effective in combination with cobalt to enhance adhesion to a substrate when exposed on the substrate to variable temperature and/or delaminative force conditions, as compared to corresponding elemental cobalt, wherein the one or more alloy component is selected from the group consisting of boron, phosphorous, tin, antimony, indium, and gold.

In a further aspect, the disclosure relates to a semiconductor device or device precursor structure, a flat-panel display, or a solar panel, comprising metallization comprising a cobalt composition comprising cobalt and one or more alloy component is selected from the group consisting of boron, phosphorous, tin, antimony, indium, and gold.

In another aspect, the disclosure relates to a method of enhancing adhesion of vapor deposited cobalt on a substrate, said method comprising vapor depositing on the substrate a cobalt composition comprising cobalt and one or more alloy component selected from the group consisting of boron, phosphorous, tin, antimony, indium, and gold.

In yet another aspect the disclosure relates to the use of one or more alloy component in a deposited cobalt composition to enhance adhesion to a substrate when the composition is exposed on the substrate to variable temperature and/or delaminative force conditions, as compared to corresponding elemental cobalt.

Other aspects, features and embodiments of the disclosure will be more fully apparent from the ensuing description, including illustrate Technical Studies 1 to 9, and the appended claims.

BRIEF DESCRIPTION OF THE DRAWINGS

FIGS. 12-35 are graphs and SEM images obtained in Technical Study 2 to illustrate the use of indium as an alloy component in vapor deposited cobalt compositions.

FIGS. 72-91 are graphs and SEM images obtained in Technical Study 9 to illustrate the use of boron as an alloy component in vapor deposited cobalt compositions, optionally with a cobalt seed layer.

DETAILED DESCRIPTION

Figure 3:
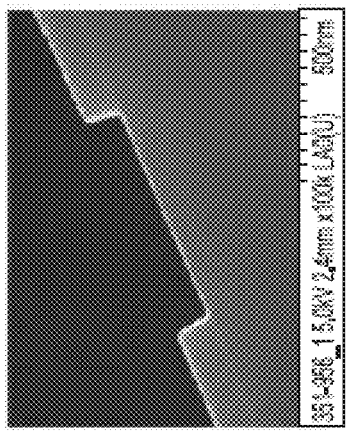
FIGS. 1-11 are SEM images obtained in Technical Study 1 to illustrate delamination of vapor deposited cobalt.

The present disclosure relates to cobalt compositions useful for fabrication of products such as semiconductor devices and device precursor structures, solar panels, and flat-panel displays, wherein cobalt is employed and adhesion of the cobalt material to associated materials of construction of such products is required. More specifically, the disclosure relates to cobalt alloy compositions comprising cobalt, and metal or metalloid co-species, which provide enhanced adhesion of cobalt in relation to elemental cobalt per se, particularly wherein cobalt thin films are utilized in the fabrication of the aforementioned products, and are subject to unit operations such as thermal cycling, chemical mechanical planarization, and the like.

As used herein and in the appended claims, the singular forms "a", "and", and "the" include plural referents unless the context clearly dictates otherwise.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the disclosure. The disclosure correspondingly contemplates such features, aspects and embodiments, or a selected one or ones thereof, in various permutations and combinations, as being within the scope of the present disclosure.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the disclosure, and that ranges of carbon numbers specifically excluding a carbon number or numbers are included in the disclosure, and sub-ranges excluding either or both of carbon number limits of specified ranges are also included in the disclosure. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the disclosure, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range. In other words, a carbon number range is deemed to affirmatively set forth each of the carbon number species in the range, as to the substituent, moiety, or compound to which such range applies, as a selection group from which specific ones of the members of the selection group may be selected, either as a sequential carbon number sub-range, or as specific carbon number species within such selection group.

The same construction and selection flexibility is applicable to stoichiometric coefficients and numerical values specifying the number of atoms, functional groups, ions or moieties, as to specified ranges, numerical value constraints (e.g., inequalities, greater than, less than constraints), as well as oxidation states and other variables determinative of the specific form, charge state, and composition applicable to chemical entities within the broad scope of the present disclosure.

"Alkyls" as used herein include, but are not limited to, methyl, ethyl, propyl, isopropyl, butyl, s-butyl, t-butyl, pentyl and isopentyl and the like. "Aryls" as used herein includes hydrocarbons derived from benzene or a benzene derivative that are unsaturated aromatic carbocyclic groups of from 6 to 10 carbon atoms. The aryls may have a single or multiple rings. The term "aryl" as used herein also includes substituted aryls. Examples include, but are not limited to phenyl, naphthyl, xylene, phenylethane, substituted phenyl, substituted naphthyl, substituted xylene, substituted phenylethane and the like. "Cycloalkyls" as used herein include, but are not limited to cyclopropyl, cyclobutyl, cyclopentyl, cyclohexyl and the like. In all chemical formulae herein, a range of carbon numbers will be regarded as specifying a sequence of consecutive alternative carbon-containing moieties, including all moieties containing numbers of carbon atoms intermediate the endpoint values of carbon number in the specific range as well as moieties containing numbers of carbon atoms equal to an endpoint value of the specific range, e.g., $C_1$-$C_6$, is inclusive of $C_1$, $C_2$, $C_3$, $C_4$, $C_5$ and $C_6$, and each of such broader ranges may be further limitingly specified with reference to carbon numbers within such ranges, as sub-ranges thereof. Thus, for example, the range $C_1$-$C_6$ would be inclusive of and can be further limited by specification of sub-ranges such as $C_1$-$C_3$, $C_1$-$C_4$, $C_2$-$C_6$, $C_4$-$C_6$, etc. within the scope of the broader range.

The present disclosure relates to cobalt alloys characterized by enhanced adhesion, as compared to cobalt alone, particularly in circumstances involving highly variable temperature exposure and/or potentially delaminating forces acting on the metal.

More specifically, the disclosure relates to cobalt alloys including minor alloy components such as boron, phosphorous, tin, antimony, indium, and gold, which in various embodiments act to reduce yield strength of the overall alloy composition at low temperature (e.g., below 400° C.) in relation to cobalt alone, so that stress accumulation otherwise incident to thermal cycling and/or exposure to latent delamination forces (delaminative forces) is reduced.

In processing operations involving thermal cycling followed by chemical mechanical planarization, the alloy compositions of the present disclosure may advantageously provide substantial improvement in performance behavior, with the alloy composition suitably lowering the yield strength (compared to cobalt alone) so that stresses relax during thermal cycling and residual stress is low for the subsequent chemical mechanical planarization operation.

In various embodiments, boron, phosphorous, tin, antimony, indium, or gold can be alloyed with cobalt, wherein the alloying component with cobalt is present at concentration below 5% by weight, based on weight of cobalt. In other embodiments, the alloying component with cobalt is present at concentration of 4.5%, 4%, 3.5%, 3%, 2.5%, 2%, 1.5%, 1%, or lower, on the same cobalt weight basis, and in still further embodiments, the alloying component with cobalt is boron, phosphorous, or antimony, and is present at concentration below 1% by weight, e.g., below 0.95%, 0.9%, 0.85%, 0.8%, 0.75%, 0.7%, 0.65%, 0.6%, 0.55%, 0.5%, 0.45%, 0.4%, 0.35%, 0.3%, 0.25%, or lower, based on the weight of cobalt.

Suitably, the alloy component may be present at a concentration of at least 0.01% by weight, at least 0.1% by weight, based on weight of cobalt.

The term "alloy", as used herein, refers to homogeneous blends of the respective alloying component and cobalt, as well as multilayer compositions including separate discrete layers of the respective cobalt and alloying component materials, and other aggregations of the respective cobalt and alloying component materials, e.g., involving dispersed discrete regions of alloying component material in a cobalt matrix, or other aggregations in which the alloying component material is present in, around, on, or under the bulk volume of cobalt, and including doping of any one or more of the alloying components in the bulk cobalt material.

Accordingly, and by way of illustrative examples, the alloying component (B, P, S, As, Sn, Sb, In, or Au) can be deposited at levels below 5% by weight (and below 1% by weight for B, P, S, As, Sb, or In) by any of various methods such as (i) continuous chemical vapor deposition or atomic layer deposition with cobalt, (ii) deposition as a layer or in multilayers with cobalt by chemical vapor deposition or atomic layer deposition, (iii) single layer formation over cobalt deposited by chemical vapor deposition or atomic layer deposition before electrodeposition or electroless deposition of cobalt fill material, wherein the single layer formation may comprise any of chemical vapor deposition, atomic layer deposition, physical vapor deposition, solution deposition, or the like, (iv) co-deposition as an alloying element in electrodeposition or electroless deposition of cobalt fill material, and (v) doping of the alloying element, including in situ doping wherein the alloying element is introduced into the cobalt material being deposited on a substrate, as well as doping of a previously deposited cobalt material on a substrate.

The compositions of the present disclosure can address the issue that deposited cobalt films recrystallize with reduced resistivity and larger grains when annealed at temperatures on the order of 400° C. Such recrystallization may involve some degree of stress relaxation of the cobalt film, but renders the deposited film susceptible to delamination at ambient temperature when subsequent processing takes place, particularly chemical mechanical planarization that is followed by post-plate and post-CMP operations.

The deposited cobalt composition may be a vapor deposited cobalt composition. In various embodiments, the composition may be vapour deposited at a temperature in the range of from 100° C. to 300° C. or higher. Advantageously, the cobalt and/or cobalt composition as a whole may be vapour deposited at a temperature of at least 120° C., at least 130° C., at least 140° C. or at least 150° C.

Cobalt may be deposited by vapor deposition in accordance with the present disclosure, using any suitable vapor deposition technique, e.g., chemical vapor deposition (CVD), atomic layer deposition (ALD), plasma-enhanced CVD, pulsed CVD, etc., and utilizing any suitable precursor or source for cobalt for the vapor deposition. For example, the cobalt precursor may comprise CCTBA, CCTMSA, CCBTMSA, or other suitable cobalt precursors.

"CCTBA" as used herein refers to dicobalt hexacarbonyl tert-butylacetylene, or to a derivative of dicobalt hexacarbonyl tert-butylacetylene as hereinafter described. Dicobalt hexacarbonyl tert-butylacetylene has the formula $Co_2(CO)_6(HCC(CH_3)_3)$,

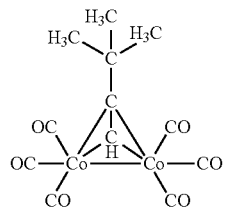

with a boiling point of 52° C. at 0.8 torr (106.7 Pa), and exists as a red liquid at 25° C.

"CCTMSA" as used herein refers to dicobalt hexacarbonyl trimethylsilyl acetylene (CCTMSA), having the formula

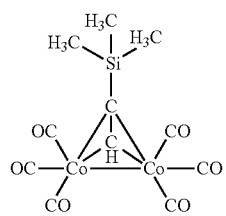

"CCBTMSA" as used herein refers to cobalt carbonyl bis(trimethylsilyl acetylene), having the formula $[((H_3Si)C\equiv C]_2Co(CO)$.

Other cobalt precursors include those selected from the group consisting of:
(a) cobalt hexacarbonyl complex precursors of the formula:

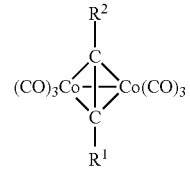

wherein $R^1$ and $R^2$ may be the same as or different from one another, and each is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes, and wherein $R^1$ and $R^2$ are not both H;
(b) cobalt silylamide precursors;
(c) cobalt (0) carbonyl complex precursors including at least one ligand selected from the group consisting of alkenes, allenes, alkynes, and Lewis base ligands;
(d) cobalt hexacarbonyl dinitrile precursors of the formula $[RN\equiv C-Co(CO)_3]_2$, wherein R is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes; and
(e) cobalt dicarbonyl nitrile precursors of the formula $(CO)_2CoN\equiv O(C\equiv NR)$ wherein R is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes.

The precursors, when in solid form, can be dissolved in appropriate solvents, e.g., hydrocarbon solvents, which facilitate liquid delivery of the precursor using liquid delivery systems coupled with a deposition reactor. The precursors can be used in liquid form, e.g., with direct liquid injection (DLI) systems, standard bubblers and modified bubblers. Delivery methods of widely varied character may be employed. The vapor deposition conditions under which the cobalt and one or more alloy components are deposited may include any suitable process conditions of cobalt and alloy component precursors, including temperature, pressure, flow rate and composition. In various embodiments, the temperature may be in a range of from 100° C. to 300° C. or higher. Suitably, the pressure may be in a range of from 10 to 100 torr or more. Optionally, the respective flow rates of the cobalt precursor and alloy component precursor(s) may be in a range of from micromoles to kilograms per minute, depending on the precursors involved, and their respective concentrations. It will be appreciated that the process conditions may be widely varied in the broad practice of the present disclosure, to provide a cobalt composition having enhanced adhesion to a substrate when exposed on the substrate to variable temperature and/or delaminative force conditions, as compared to corresponding elemental cobalt.

The features and advantages of the cobalt compositions of the present disclosure are more fully shown in the ensuing description, with reference to indium as an alloy component species.

Indium may be utilized as a dopant species in cobalt deposition, to provide significant benefit in adhesive character of the deposited cobalt composition. For example, cobalt may be deposited with doping of indium at a concentration of 0.025 to 0.15 atomic weight percent (at %) or more, based on atomic weight of the indium-doped cobalt, i.e., to yield $In_xCo_{x-1}$, wherein x is from 0.025 to 0.15 or more. Indium may be deposited under vapor deposition conditions with the cobalt, utilizing a suitable indium precursor, as for example trimethyl indium (TMI) or other alkyl indium precursor compound, or other organo indium precursor compound or complex, and wherein cobalt is deposited from any suitable cobalt precursor, e.g., CCTMSA.

The present disclosure provides a vapor deposited cobalt composition, comprising cobalt and one or more alloy component that is effective in combination with cobalt to enhance adhesion to a substrate when exposed on the substrate to variable temperature and/or delaminative force conditions, as compared to corresponding elemental cobalt, wherein the one or more alloy component is selected from the group consisting of boron, phosphorous, tin, antimony, indium, and gold.

Variable temperature conditions may comprise thermal cycling of the deposited cobalt composition, and the delaminative force conditions may comprise chemical mechanical planarization of the deposited cobalt composition. In various embodiments, the variable temperature and/or delaminative force conditions comprise thermal cycling of the deposited cobalt composition followed by chemical mechanical planarization of the deposited cobalt composition.

The above-described vapor deposited cobalt composition may be constituted in various embodiments, wherein the one or more alloy component is present at concentration below 5% by weight, based on weight of cobalt in the composition. In other embodiments, the one or more alloy component is present at concentration below 1% by weight, based on weight of cobalt in the composition.

The vapor deposited cobalt composition may be of varied form. In various embodiments, the composition may comprise a homogeneous blend of cobalt and the one or more alloy component. In other embodiments, the composition may comprise discrete layers of respective cobalt and one or more alloy component. In still other embodiments, the vapor deposited cobalt composition may comprise dispersed discrete regions of the one or more alloy component in a bulk volume of the cobalt. In yet other embodiments, the vapor deposited cobalt composition may be constituted, wherein the one or more alloy component is present in, around, on, or under a bulk volume of the cobalt. In various embodiments, the one or more alloy component may be doped in the cobalt.

The cobalt precursor utilized in forming the cobalt composition of the present disclosure may be of any suitable type, and the cobalt in the vapor deposited cobalt composition may be deposited from vapor of a cobalt precursor selected from the group consisting of CCTBA, CCTMSA, and CCBTMSA. The cobalt may for example be deposited from vapor of CCTMSA. In other embodiments, the cobalt may be deposited from vapor of a cobalt precursor selected from the group consisting of:

(A) cobalt hexacarbonyl complex precursors of the formula:

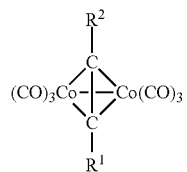

wherein $R^1$ and $R^2$ may be the same as or different from one another, and each is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes, and wherein $R^1$ and $R^2$ are not both H;

(B) cobalt silylamide precursors;

(C) cobalt (0) carbonyl complex precursors including at least one ligand selected from the group consisting of alkenes, allenes, alkynes, and Lewis base ligands;

(D) cobalt hexacarbonyl dinitrile precursors of the formula [RN≡C—Co(CO)$_3$]$_2$, wherein R is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes; and (E) cobalt dicarbonyl nitrile precursors of the formula (CO)$_2$CoN≡O(C≡NR) wherein R is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes.

In various embodiments, the one or more alloy component in the vapor deposited cobalt composition of the present disclosure may comprise indium. The indium may be doped in the cobalt, e.g., at a concentration of from 0.025 to 0.15 at %, based on the doped cobalt composition. Indium, when utilized as a dopant species, may be vapor deposited from an indium precursor of any suitable type, e.g., trimethyl indium, or other alkyl indium or organoindium compound or complex. In other embodiments, the one or more alloy component may comprise boron, e.g., doped at corresponding concentrations, and provided from suitable boron precursors, such as trimethylborane or other organoboron source reagent.

In various embodiments, the vapor deposited cobalt composition of the disclosure is deposited on a cobalt seed film. In such embodiments, the one or more alloy component may be selected from the group consisting of boron, tin, antimony, indium, and gold, e.g., the alloy component may comprise indium. In various embodiments, the cobalt seed film may have a thickness in a range of from 2 to 10 nm. The cobalt seed film in various embodiments may be deposited on an oxide material, e.g., silicon dioxide, wherein for example the alloy component may comprise indium, or boron.

The deposited cobalt composition, as variously described above, may be deposited in a trench or via of a semiconductor device substrate or semiconductor device precursor structure substrate.

The disclosure relates in a further aspect to a semiconductor device or device precursor structure, a flat-panel display, or a solar panel, comprising metallization comprising a cobalt composition comprising cobalt and one or more alloy component is selected from the group consisting of boron, phosphorous, tin, antimony, indium, and gold.

It will therefore be appreciated that the present disclosure contemplates a wide variety of potential cobalt compositions in which one or more alloy component is contained to effect stress relaxation of the cobalt composition in applications in which the composition is subjected to thermal cycling and/or mechanical forces that would tend to delaminate the cobalt composition, and that the delamination resistance of the cobalt metallization in various applications can be significantly enhanced by the use of alloy component(s) in accordance with the present disclosure.

The disclosure relates in another aspect to a method of enhancing adhesion of vapor deposited cobalt on a substrate, such method comprising depositing on the substrate a cobalt composition according to any aspect or embodiment of this disclosure. Suitably, the method may comprise vapor depositing the cobalt composition.

In various embodiments of such method, the substrate may be exposed to variable temperature and/or delaminative force conditions after cobalt and the one or more alloy component are vapor deposited thereon.

The disclosure relates in yet another aspect to the use of one or more alloy component in a deposited cobalt composition for the purpose of enhancing adhesion to a substrate when the composition is exposed on the substrate to variable temperature and/or delaminative force conditions, as compared to corresponding elemental cobalt. The alloy component, deposited cobalt composition, substrate and conditions may be as described herein in respect of any other aspect or embodiment of the disclosure.

Study 1—Delamination of Vapor Deposited Cobalt

In a specific series of tests, cobalt was deposited on a substrate at temperature of 130° C. and pressure of 30 torr, and adhesion and resistivity properties were evaluated following rapid thermal annealing in nitrogen (RTN) at 400° C.

Figure 1:
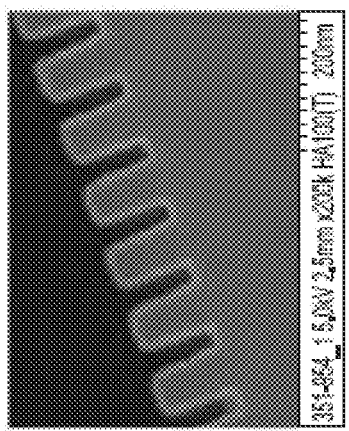

FIG. 1 is a backscatter SEM image of a cross-section of a cobalt coated substrate, in RTN annealing, showing that the cobalt film delaminated at corners of the recess after 400 which the substrate included a series of 55 nm wide trenches having an aspect ratio of 2. Cobalt was vapor deposited from CCTMSA cobalt precursor at temperature of 130° C. and pressure of 30 torr, with a 20 minute deposition having been carried out to yield 9.1 nm thickness of cobalt on the substrate trenches.

Figure 2:
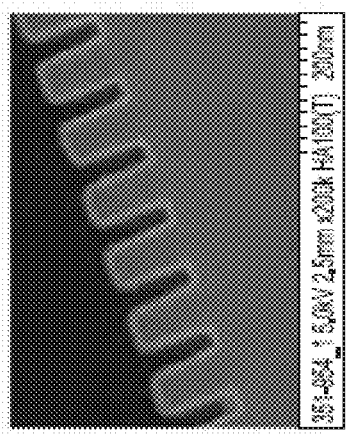

FIG. 2 shows SEM images of the cross-section of the cobalt coated substrate of FIG. 1, after rapid thermal annealing in nitrogen (RTN) of the cobalt at 400° C. Annealed Cobalt delaminated at the trench bottom. FIG. 3 is a SEM image of a 0.7 μm size recess on which Cobalt was vapor deposited from CCTMSA precursor at temperature of 130° C. and pressure of 30 Torr, with a 20 minute deposition having carried out to yield 9.1 nm thickness of cobalt on the substrate recess, and subjected to 400° C. annealing, showing that the cobalt film delaminated at corners of the recess after 400° C. annealing.

Figure 5:
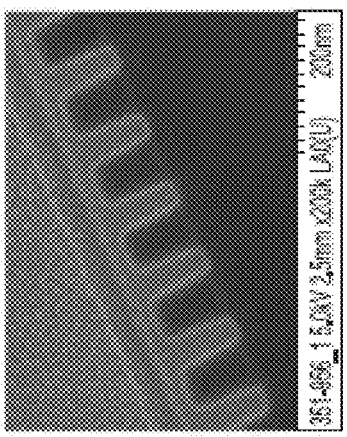
Figure 4:
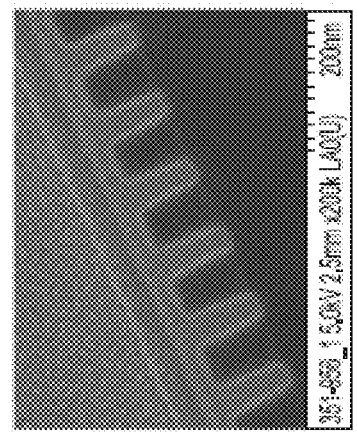

FIGS. 4 and 5 are focused ion beam (FIB)/SEM images of 55 nm trench structures on which cobalt was vapor deposited from CCTMSA cobalt precursor at temperature of 130° C. and pressure of 30 torr, with a 20 minute deposition having been carried out to yield 9.1 nm thickness of cobalt on the substrate trenches, showing that no delamination occurred after the 400° C. RTN annealing.

Figure 6:
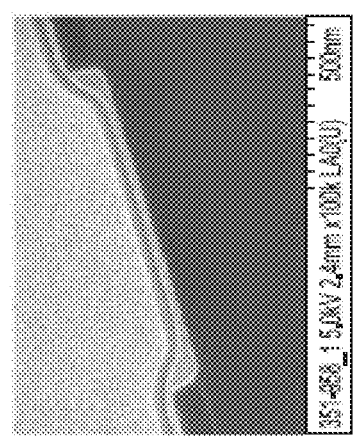
Figure 7:
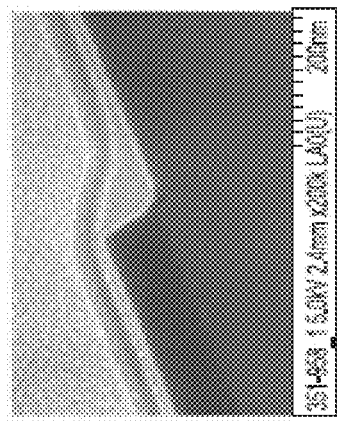

FIGS. 6 and 7 are FIB/SEM images of a 1 μm size recess on which cobalt was vapor deposited from CCTMSA cobalt precursor at temperature of 130° C. and pressure of 30 torr, with a 20 minute deposition having been carried out to yield 9.1 nm thickness of cobalt on the substrate recess, and subjected to 400° C. RTN annealing, showing that the cobalt film delaminated at corners of the recess after 400° C. RTN annealing.

Figure 9:
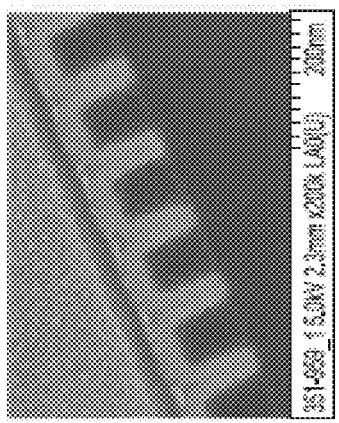
Figure 8:
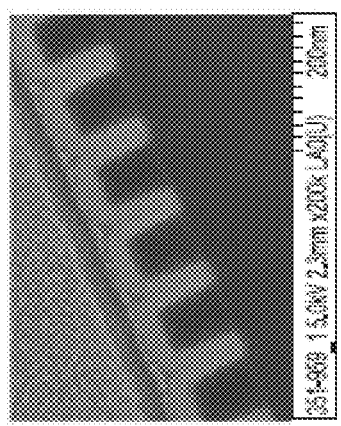

FIGS. 8 and 9 are FIB/SEM images of a 55 nm trench structure on which cobalt was vapor deposited from CCTMSA cobalt precursor at temperature of 130° C. and pressure of 30 torr, with a 60 minute deposition having been carried out to yield 30 nm thickness of cobalt on the substrate recess, and subjected to 400° C. RTN annealing, in which cobalt film delamination was observed after the annealing.

Figure 11:
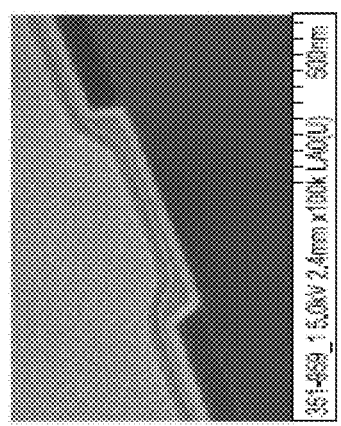
Figure 10:
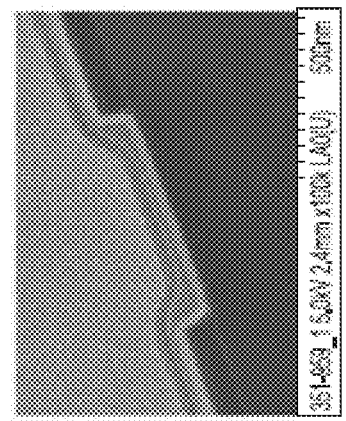

FIGS. 10 and 11 are FIB/SEM images of a 0.7 μm size recess substrate structure on which cobalt was vapor deposited from CCTMSA cobalt precursor at temperature of 130° C. and pressure of 30 torr, with a 60 minute deposition having been carried out to yield 30 nm thickness of cobalt on the substrate recess, and subjected to 400° C. RTN annealing, in which cobalt film delamination is shown at the corners of the recess after the annealing.

Study 2—Possible Mechanism of Delamination

Table 1 below sets out for cobalt and for various other metal/metalloid species a tabulation of coefficient of thermal expansion, in parts per million (ppm)/degrees centigrade (° C.), bulk modulus in gigaPascals (GPa), relative stress at 400° C., in milliPascals (MPa), and Vickers Hardness, in milliPascals (MPa).

TABLE 1

| Material | CTE (ppm/° C.) | Bulk Modulus (GPa) | Relative stress 400° C. (Mpa) | Vickers Hardness (MPa) |
| --- | --- | --- | --- | --- |
| Si | 2.6 | 100 | | |
| Cu | 16.5 | 140 | 778.4 | 369 |
| Al | 23.1 | 76 | 623.2 | 167 |
| Co | 13 | 180 | 748.8 | 1043 |
| W | 4.5 | 310 | 235.6 | 3430 |
| Mo | 4.8 | 230 | 202.4 | 1530 |

As shown by the data in Table 1, tungsten (W) and molybdenum (Mo) exhibit closely similar CTE values in relation to one another, so that such materials, when in contact with a silicon substrate, would exhibit relatively low differential CTE-associated stress, as strain is only about 2 ppm/° C. Despite the high differential CTE of aluminum and copper, they both have low strength, and their interfacial stress is limited by the metal's yield strength. Cobalt has high differential CTE, >10 ppm/° C., and high yield strength, representing a worst-case combination of such physical properties for susceptibility to delamination.

In thermal cycling, cobalt in thin film form undergoes martensitic transformation that entails accumulation of stress in such material, which generally does not exceed 50 MPa. Initial thermal cycling may generate compressive stress that is relieved by recrystallization above 300° C. and by creep at higher temperatures. Subsequent relaxation is above 350° C.

In accordance with the present disclosure, alloying elements are added to cobalt to allow stress relief to occur at lower temperature without affecting resistivity. In general, a low solid solubility of the alloying element is desired in the low temperature, hexagonal close packed (hcp) epsilon phase material, and the alloying element desirably lowers the effective melting temperature of the cobalt film.

Study 3—Identification of Candidate Alloy Components

Tin and indium are alloying elements of cobalt that are beneficial to the presence of copper in the substrate structure to which cobalt is applied by vapor phase deposition. Carbon, tungsten, and titanium individually or together increase strength and decrease ductility of cobalt films. Aluminum, tungsten, oxygen, carbon, molybdenum, nickel, palladium, platinum, and ruthenium do not lower the melting temperature, $T_m$, of cobalt. Lead and bismuth have been found to mediate liquid phase embrittlement.

Gallium, germanium, silicon, chromium, iron, and manganese have high solubility in epsilon cobalt, and copper may provide slight benefit to cobalt in respect of stress relief. However, the high solubility in the bulk of the cobalt will increase the resistivity of the cobalt.

In general, phosphorus, boron, and indium are beneficial alloying elements at concentrations not exceeding 1% by weight, based on weight of cobalt. Tin, Antimony, and gold are beneficial alloying elements at concentrations of from 3 to 5% by weight, based on weight of cobalt. Silver, tellurium, and selenium have immiscible liquid phases, and effective melting point may still be high. Indium is an excellent alloying element with appropriate thermal management of the deposition process. Zinc may have useful solubility and is needed in an amount of greater than 30% by weight, based on weight of cobalt, to lower the melting point of cobalt.

Specific data are set out in Tables 2 below for various candidate alloying elements.

TABLE 2

| Element | $T_m$ (° C.) | @ at % | Solubility <400° C. | |
| --- | --- | --- | --- | --- |
| B | 1110 | <1 | <1 | Good |
| C | 1320 | 4.1 | <1 | Neutral |
| O | 1451 | <1 | <1 | Neutral |
| Al | 1400 | 15 | <1 | Neutral |
| Si | 1180 | 15 | 8 | Bad |
| P | 1023 | <1 | <1 | Good |
| S | 877 | <1 | <1 | Good |
| Cr | 1395 | 44 | >5 | Bad |
| Mn | 1160 | 60 | 10 | Bad |
| Fe | 1475 | 30 | 10 | Bad |
| Ni | 1480 | High | High | Bad |
| Cu | 1112 | 13 | <1 | Perhaps |
| Zn | 986 | 37.5 | <5 | Perhaps |
| Ga | 1210 | 19 | 12 | Bad |
| Ge | 1123 | 16 | 16 | Bad |
| As | 997 | 3 | <1 | Good |
| Se | 1448 | <1 | <1 | Neutral |
| Mo | 1325 | 20 | 5 | Bad |
| Ru | 1300 | 8 | High | Bad |
| Pd | 1217 | 50 | High | Bad |
| Ag | 1489 | <1 | <1 | Neutral |
| In | 1286 | <1 | <1 | Neutral |
| Sn | 1112 | 4 | <1 | Good |
| Sb | 1113 | 2.5 | <1 | Good |
| Te | 1460 | <1 | <1 | Neutral |
| W | 1473 | 20 | <1 | Neutral |
| Ir | 1490 | 50 | High | Bad |
| Pt | 1410 | 20 | High | Bad |
| Au | 997 | 2 | <1 | Good |
| Pb | 1492/327 | <1 | <1 | Bad |
| Bi | 1345/271 | <1 | <1 | Bad |

B, P, As, and Sb are all used in other parts of the semiconductor process. Sn and Au are more traditional metal alloying elements. S is a trace impurity in copper metallization.

Study 4—Indium as Alloy Component

Indium was used to dope cobalt films during the cobalt deposition at a concentration of 5 at % and the impact of such doping on delamination was investigated.

The doping of the cobalt films was carried out with trimethylindium (TMI) as an indium precursor, at a delivery rate of cobalt precursor (CCTMSA) of 2 μmol/minute, and a delivery rate of TMI of 0.1 μmol/minute, to provide indium doping of the deposited cobalt film that would enable stress relief in the deposited cobalt film to occur at lower temperature, without affecting resistivity of the deposited film. It is noted that indium has limited solubility in ε-Co.

Figure 12:
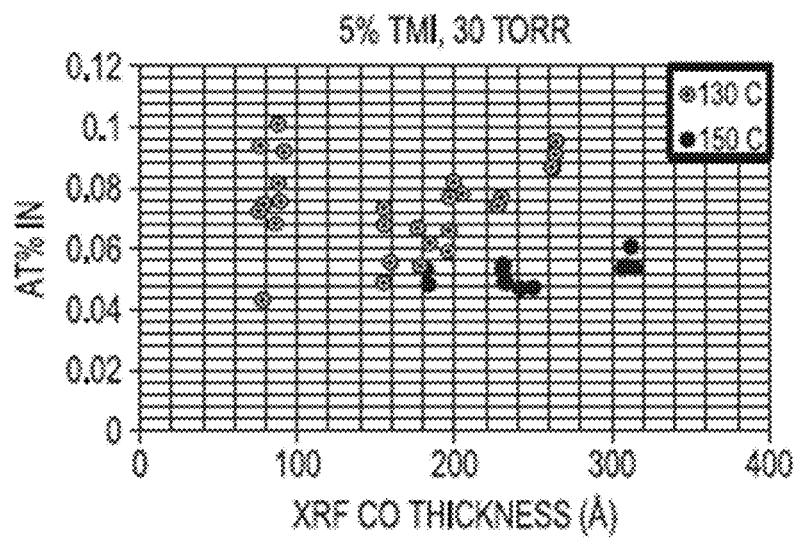

FIG. 12 is a graph of indium concentration, in atomic percent, as a function of thickness, in Ångströms, of the cobalt film, as determined by x-ray fluorescence (XRF) determination, for indium-doped cobalt films deposited at 130° C. (lighter data points), and at 150° C. (red data points). The XRF measurements had a 1 sigma precision of +0.04 Å at 1 Å thickness.

The solubility of indium in the as-deposited cobalt films was less than 0.1 atomic percent (at. %). More indium was incorporated at the 130° C. deposition temperature than at the 150° C. temperature, owing to instability of TMI at temperatures greater than about 140° C.

Figure 13:
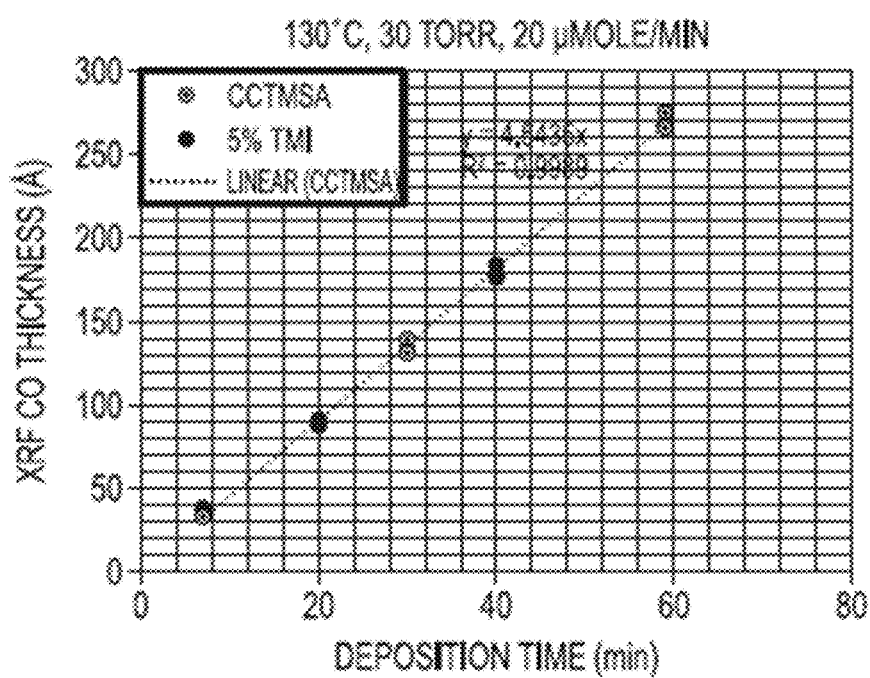

FIG. 13 is a graph of cobalt film thickness, in Ångströms, as determined by XRF determination, as a function of deposition time, in minutes, for cobalt films deposited at temperature of 130° C., pressure of 30 torr, and delivery rate of 2 μmol/minute, with cobalt film deposited without any co-species metal, denoted as "CCTMSA" with lighter data points, and with cobalt film deposited at the same conditions and doped with indium from TMI precursor at TMI delivery rate of 0.1 μmol/minute being denoted as "5% TMI" with darker data points.

Figure 14:
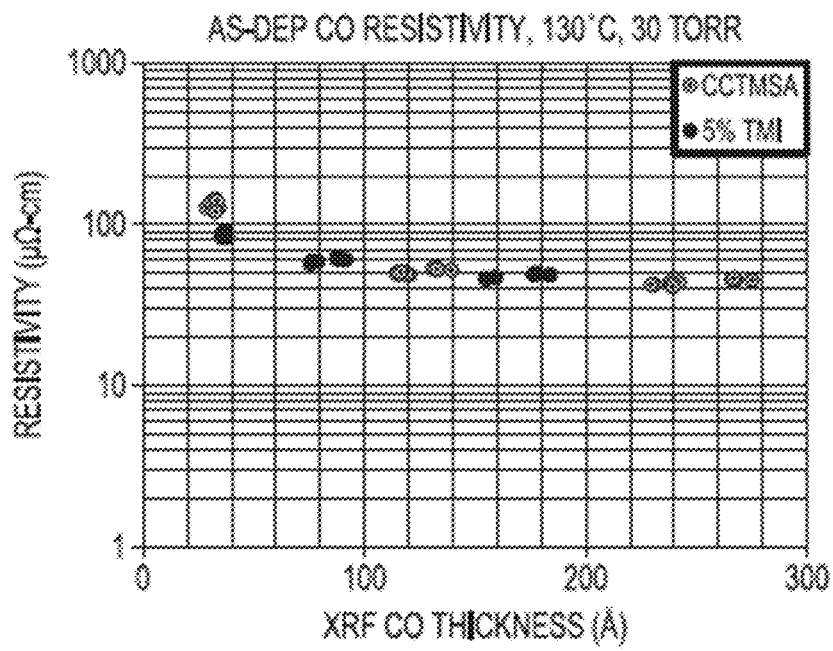

FIG. 14 is a corresponding graph of resistivity, in μΩ-cm, as a function of cobalt thickness, in Ångströms as determined by XRF determination, for cobalt films deposited at temperature of 130° C., pressure of 30 torr, and delivery rate of 2 μmol/minute, with cobalt film deposited without any co-species metal, denoted as "CCTMSA" with lighter data points, and with cobalt film deposited at the same conditions and doped with indium from TMI precursor at TMI delivery rate of 0.1 μmol/minute being denoted as "5% TMI" with darker data points.

The results of FIG. 14 show that indium doping does not affect the resistivity of the indium-doped cobalt film deposited at 130° C.

Figure 15:
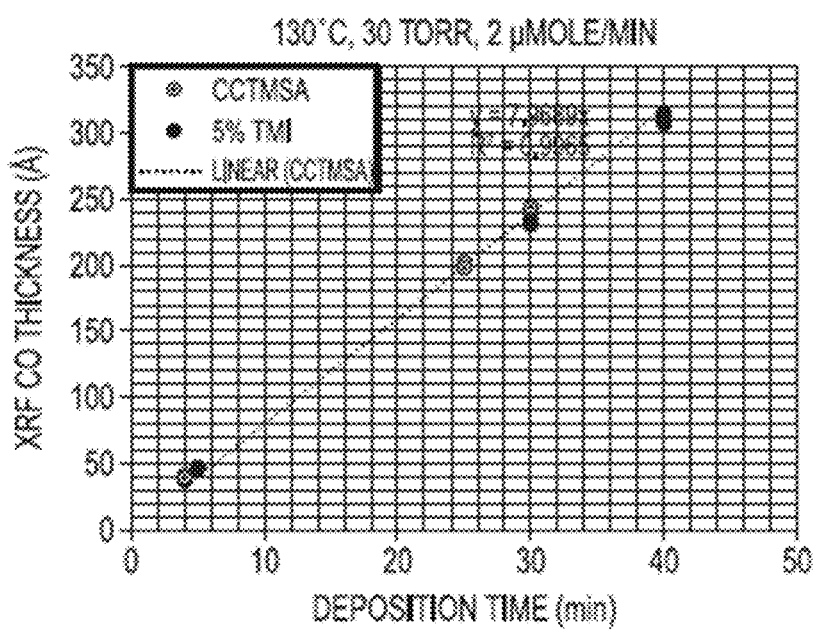

FIG. 15 is a graph of cobalt film thickness, in Ångströms, as determined by XRF determination, as a function of deposition time, in minutes, for cobalt films deposited at temperature of 150° C., pressure of 30 torr, and delivery rate of 2 μmol/minute, with cobalt film deposited without any co-species metal, denoted as "CCTMSA" with lighter data points, and with cobalt film deposited at the same conditions and doped with indium from TMI precursor at TMI delivery rate of 0.1 μmol/minute being denoted as "5% TMI" with darker data points.

Figure 16:
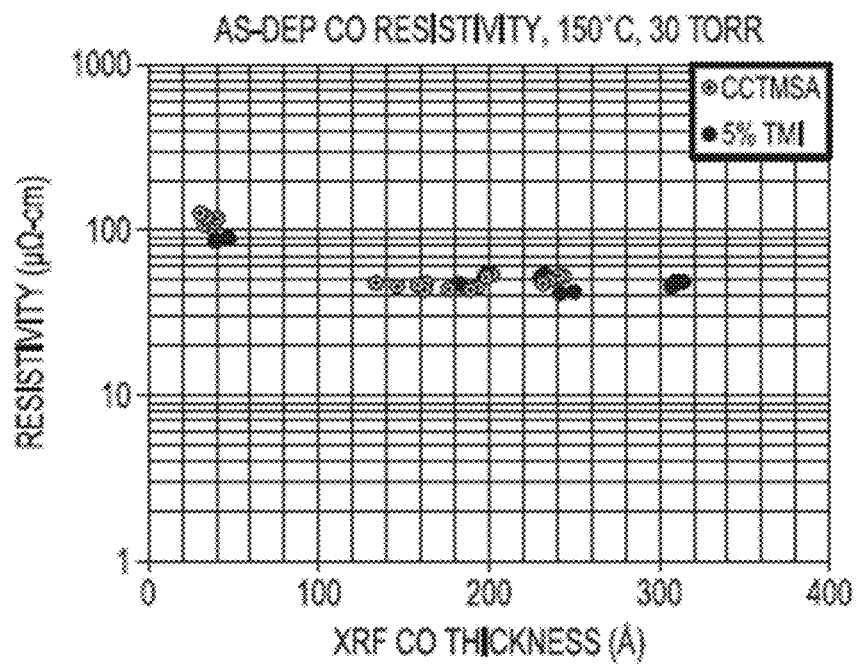

FIG. 16 is a corresponding graph of resistivity, in μΩ-cm, as a function of cobalt thickness, in Ångströms as determined by XRF determination, for cobalt films deposited at temperature of 150° C., pressure of 30 torr, and delivery rate of 2 μmol/minute, with cobalt film deposited without any co-species metal, denoted as "CCTMSA" with lighter data points, and with cobalt film deposited at the same conditions and doped with indium from TMI precursor at TMI flow rate of 0.1 μmol/minute being denoted as "5% TMI" with darker data points.

The results of FIG. 16 show that indium doping does not affect the resistivity of the indium-doped cobalt film deposited at 150° C.

Figure 17:
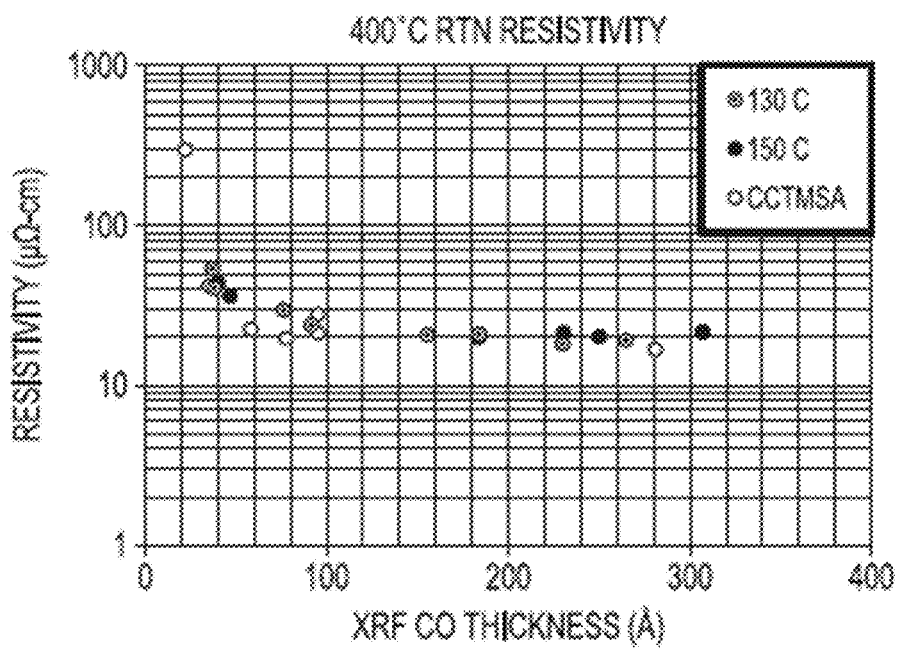

FIG. 17 is a graph of resistivity, in µΩ-cm, as a function of cobalt thickness, in Ångströms as determined by XRF determination, for indium-doped cobalt films deposited at 130° C. (lighter data points), and at 150° C. (red data points), as a function of indium-doped cobalt film thickness, in Ångströms, as determined by XRF determination, after RTN annealing at 400° C. The results showed that indium doping does not affect the annealed resistivity.

Surface morphology was assessed for corresponding cobalt films, with and without indium doping, to determine whether indium doping produced any change in surface morphology.

Figure 18:
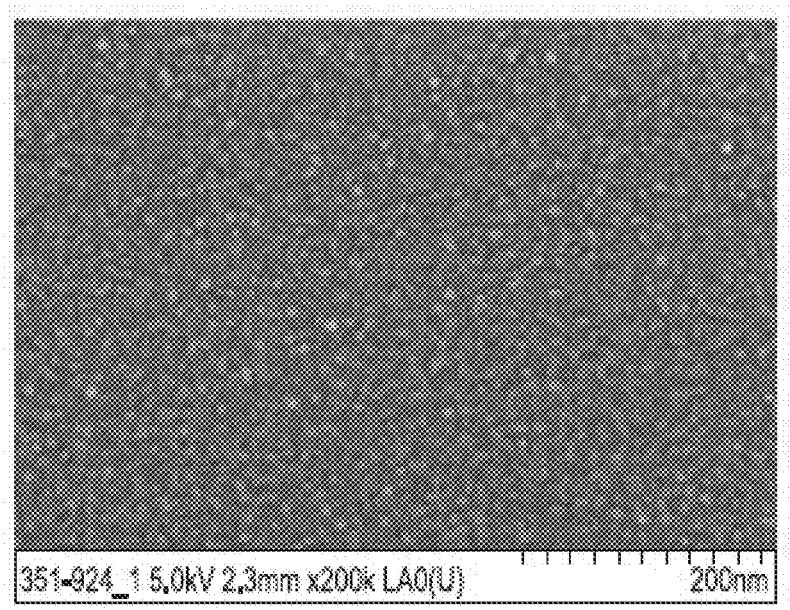

FIG. 18 is an SEM image of a cobalt film deposited at 150° C. and pressure of 30 torr producing a 4.4 nm thickness of cobalt film, with no doping.

Figure 19:
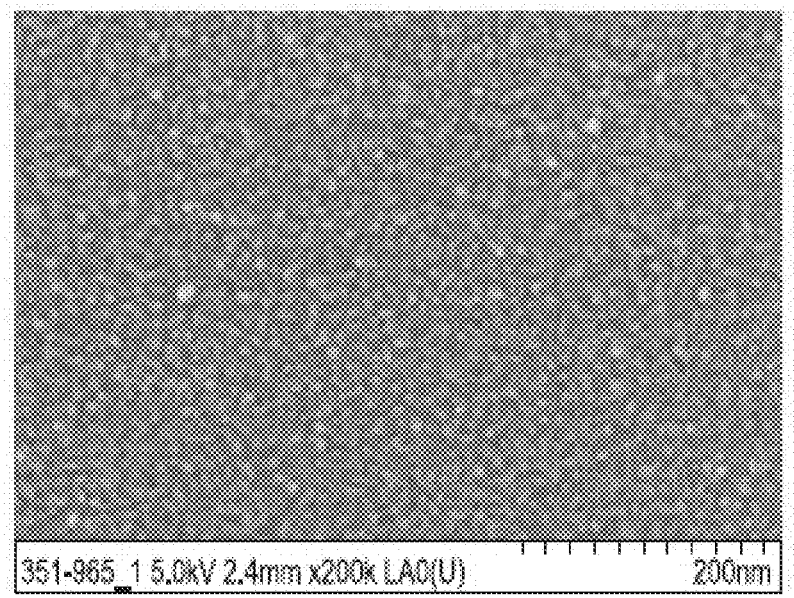

FIG. 19 is an SEM image of an indium-doped cobalt film deposited at 150° C. and pressure of 30 torr producing a 4.7 nm thick indium-doped film, wherein indium doping was carried out at a doping level of 0.05 at % indium, based on the overall film ($In_{0.05}Co_{99.95}$).

The respective SEM images of FIGS. 18 and 19 show that indium doping produced no change in surface morphology of the deposited cobalt film.

Adhesion tests were then conducted on cobalt films and indium-doped cobalt films, to determine whether indium doping produced any change in adhesion of the corresponding film. A film tape test was carried out, with the results shown in FIGS. 20 and 21.

Figure 20:
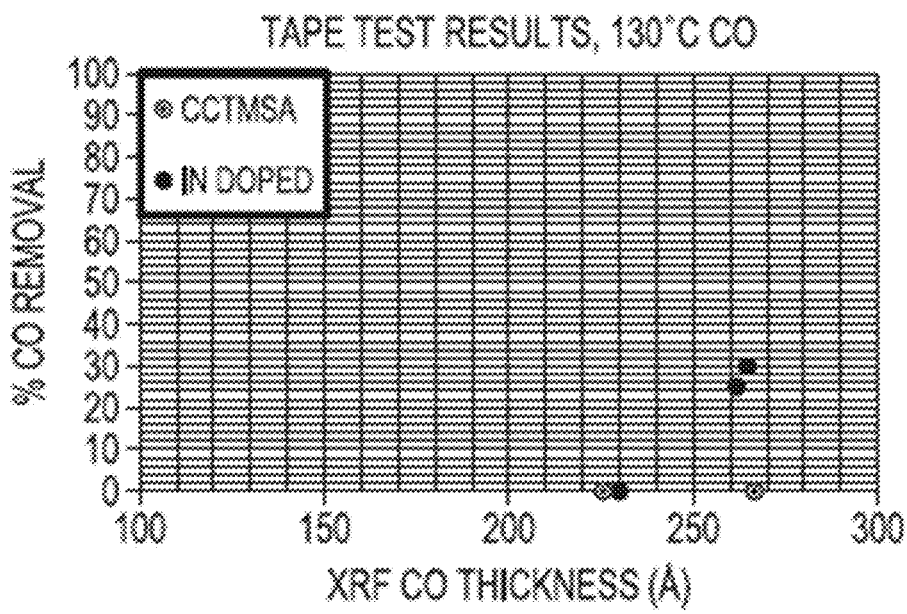

FIG. 20 is a graph of percent cobalt film removal, for doped (darker data points) and undoped (lighter data points) cobalt films deposited at 130° C., as a function of cobalt film thickness, in Ångströms.

Figure 21:
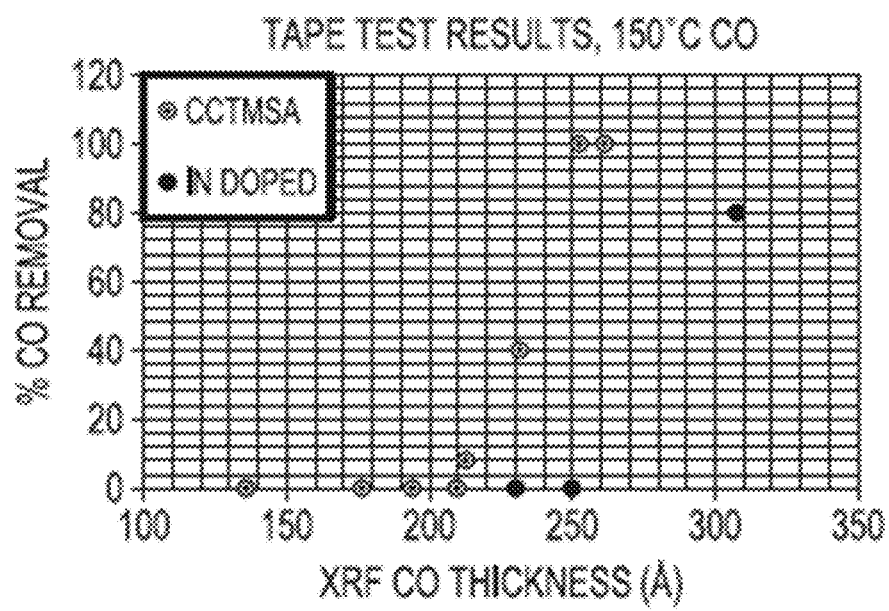

FIG. 21 is a graph of percent cobalt film removal, for doped (darker data points) and undoped (lighter data points) cobalt films deposited at 150° C., as a function of cobalt film thickness, in Ångströms.

The results shown in FIGS. 20 and 21 reflect improvement of adhesion by indium doping in the cobalt films deposited at 150° C., but with lesser effect in cobalt films deposited at 130°.

FIG. 22 is an SEM image for indium-doped cobalt deposited at 130° C., pressure of 30 torr, for 60 minute deposition, with doping from a 5% TMI dopant stream (TMI+carrier gas), followed by 400° C. RTN annealing.

FIG. 23 is an SEM image for cobalt deposited at 130° C., pressure of 30 torr, for 60 minute deposition, with no doping, followed by 400° C. RTN annealing.

The results of FIGS. 22 and 23 showed that indium doping at less than 0.1 at % improved cobalt film adhesion.

FIG. 24, FIG. 25, and FIG. 26 are SEM images, for indium-doped cobalt deposited at temperature of 150° C., pressure of 30 torr, 30 minute deposition duration, and doping from a 5% TMI dopant stream (TMI+carrier gas), followed by 400° C. RTN annealing. These images showed that 0.05 at % doping of cobalt films improved cobalt adhesion Similar results were achieved at 40 minute deposition duration, with corresponding temperature, pressure, and annealing conditions.

Figure 27:
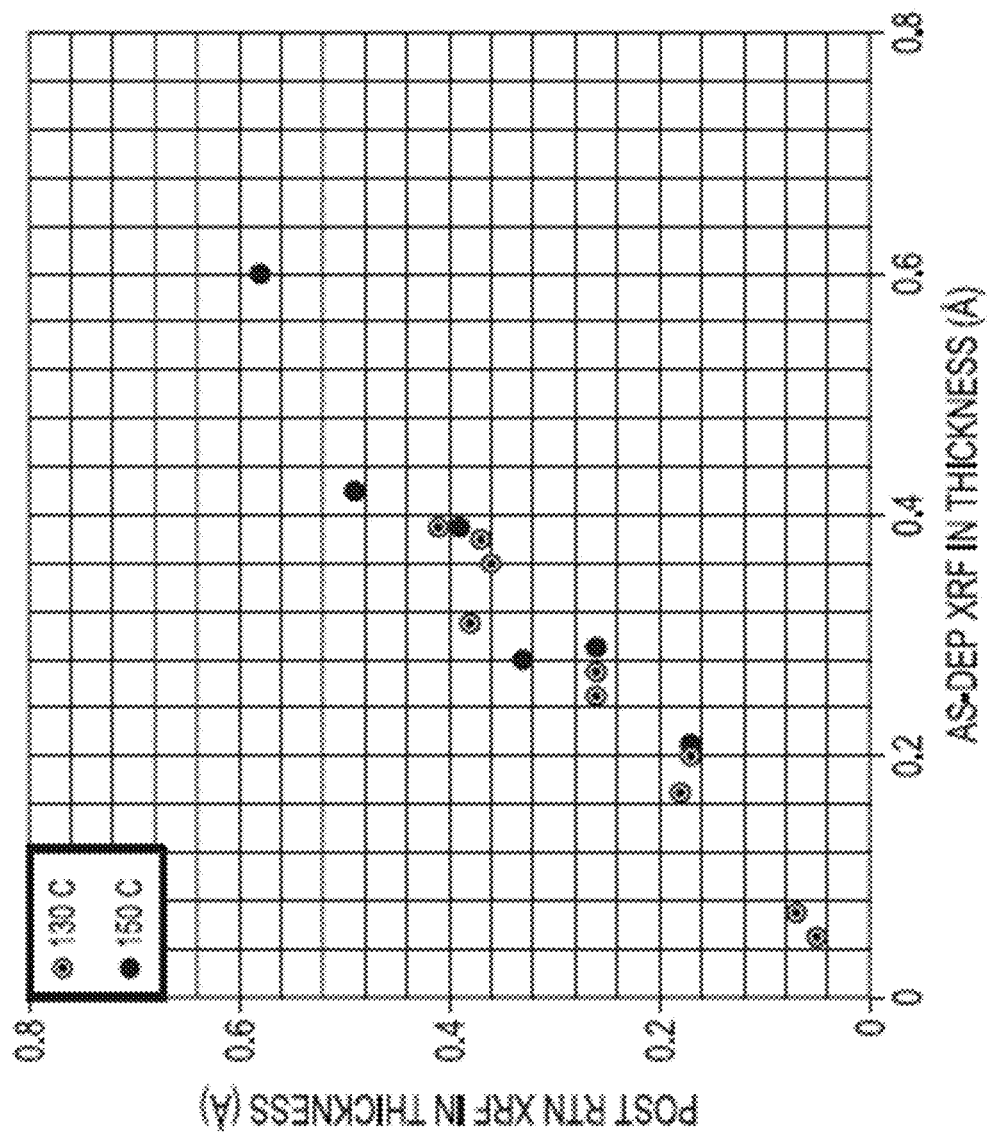

FIG. 27 is a graph of XRF indium thickness, in Ångströms, as determined after 400° C. RTN annealing, for cobalt films doped with indium from a 5% TMI dopant stream (TMI+carrier gas) for respective cobalt deposition temperatures of 130° C. (lighter data points) and 150° C. (darker data points), as a function of XRF as-deposited indium thickness, in Ångströms. The results show that 400° C. RTN processing does not reduce the concentration of indium dopant.

Figure 28:
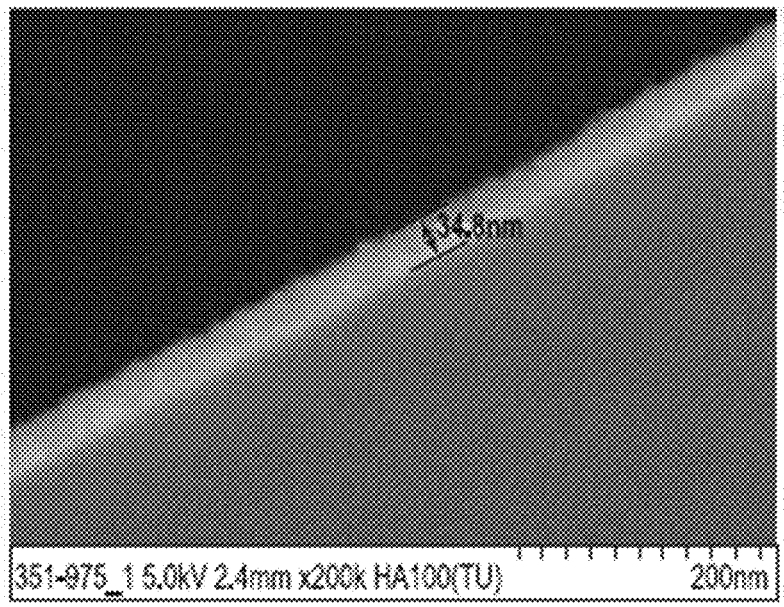
Figure 29:
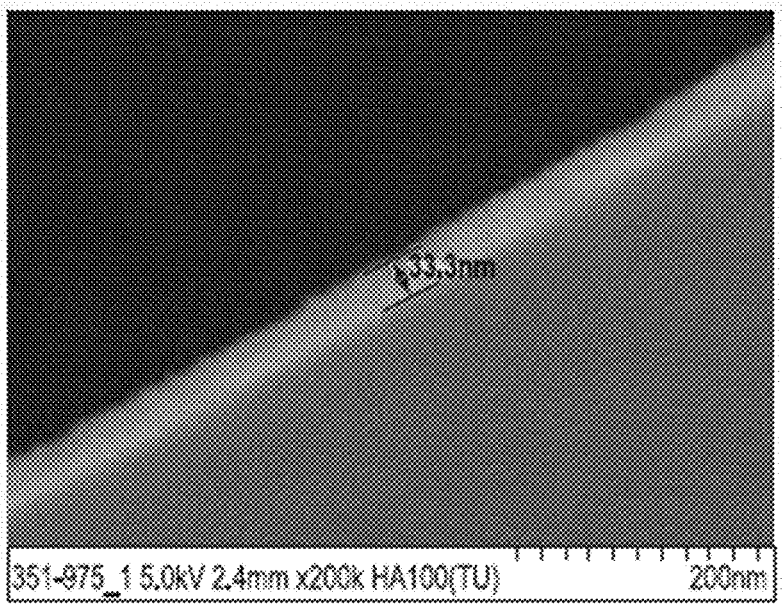

FIGS. 28 and 29 are SEM cross-section images of indium doped cobalt deposited at 150° C. and pressure of 30 torr, at cobalt thickness of 312 Å, wherein the film exhibited density of 91.9% of the as-deposited cobalt density.

Figure 30:
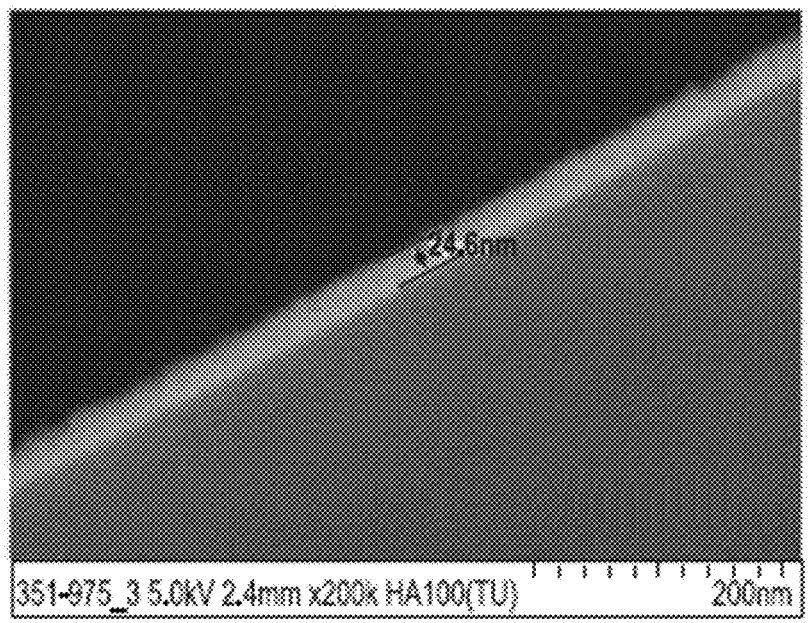
Figure 31:
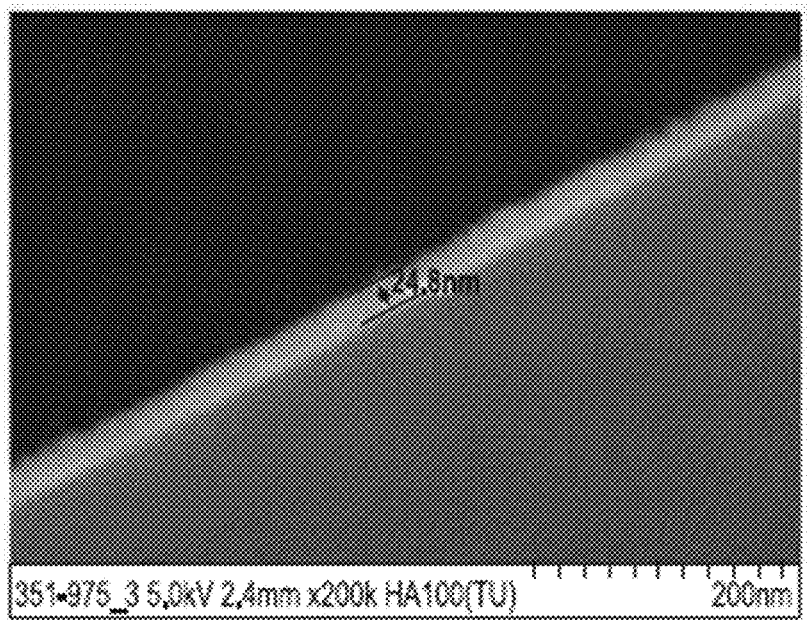

FIGS. 30 and 31 are SEM cross-section images of indium doped cobalt deposited at 150° C. and pressure of 30 torr, at cobalt thickness of 231 Å, wherein the film exhibited density of 93.5% of the as-deposited cobalt density.

Figure 32:
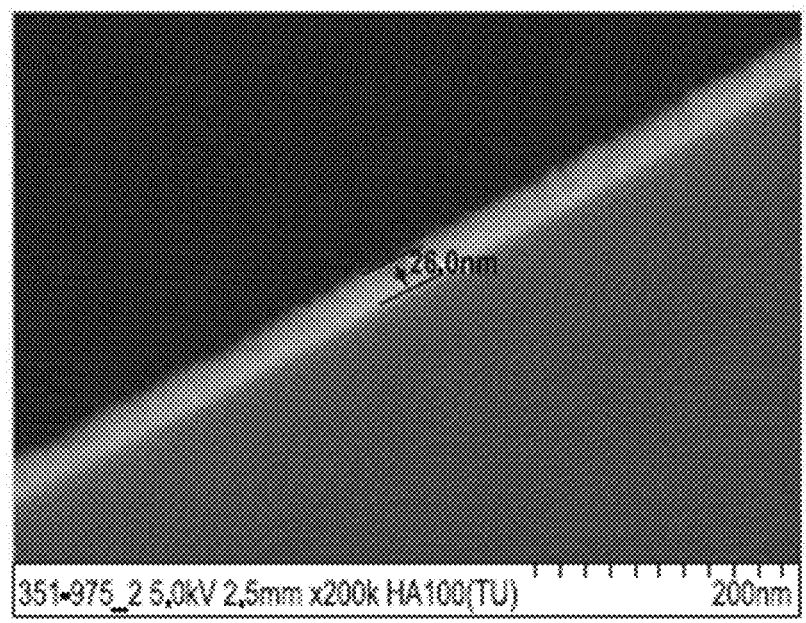
Figure 33:
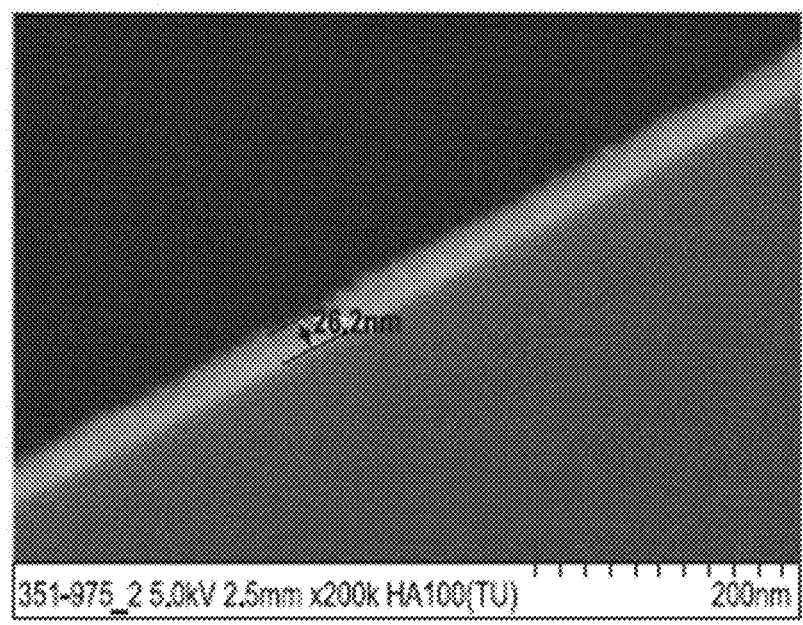

FIGS. 32 and 33 are SEM cross-section images of indium doped cobalt deposited at 150° C. and pressure of 30 torr, at cobalt thickness of 264 Å, wherein the film exhibited density of 100% of the as-deposited cobalt density.

Figure 34:
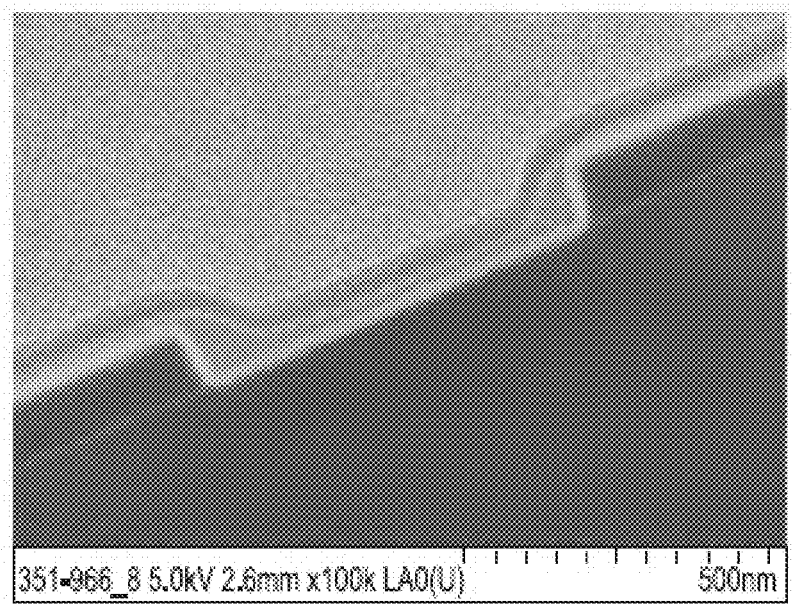

FIG. 34 is an SEM image for indium-doped cobalt deposited at 150° C., pressure of 30 torr, on an annealed substrate.

Figure 35:
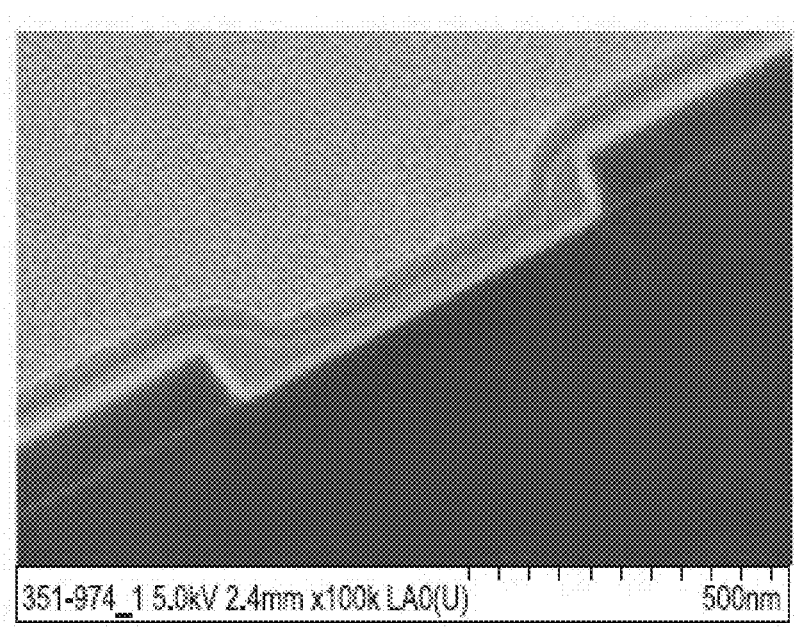

FIG. 35 is an SEM image for cobalt deposited at 150° C., pressure of 30 torr, with no doping, on an annealed substrate.

Study 5—Phosphorous as Alloy Component

In additional implementations, cobalt films were doped with phosphorous, utilizing 5% trimethyl phosphorous (TMP) in carrier gas as the phosphorus source material, and delivery rates of 2 µmole/min. of cobalt precursor, and 0.1 µmole/min. of TMP.

Figure 36:
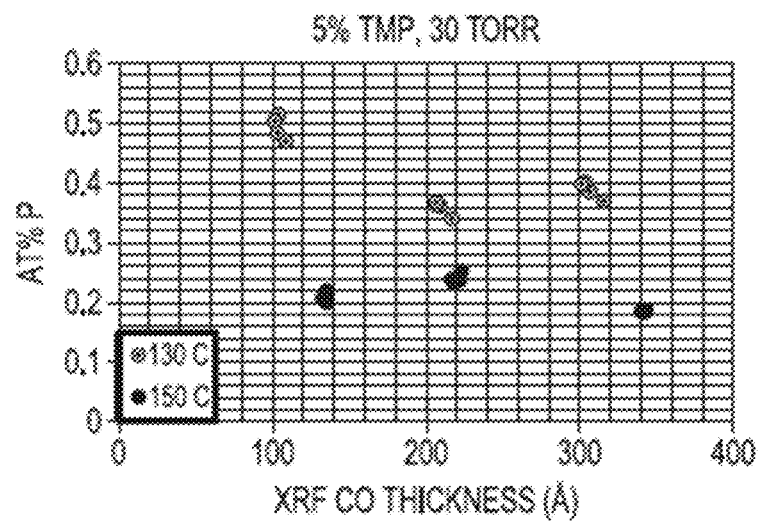
FIGS. 36-67 are graphs and SEM images obtained in Technical Study 5 to illustrate the use of phosphorous as an alloy component in vapor deposited cobalt compositions.

FIG. 36 is a graph of atomic percent of phosphorus in the as-deposited P-doped cobalt film, as a function of XRF cobalt thickness, in Ångströms, for phosphorus-doped cobalt films deposited at 130° C. (lighter data points) and at 150° C. (darker data points). The data show limited solubility (<0.6 at %) of phosphorus in the as-deposited cobalt films. More phosphorus was detected at 130° C. deposition.

Figure 37:
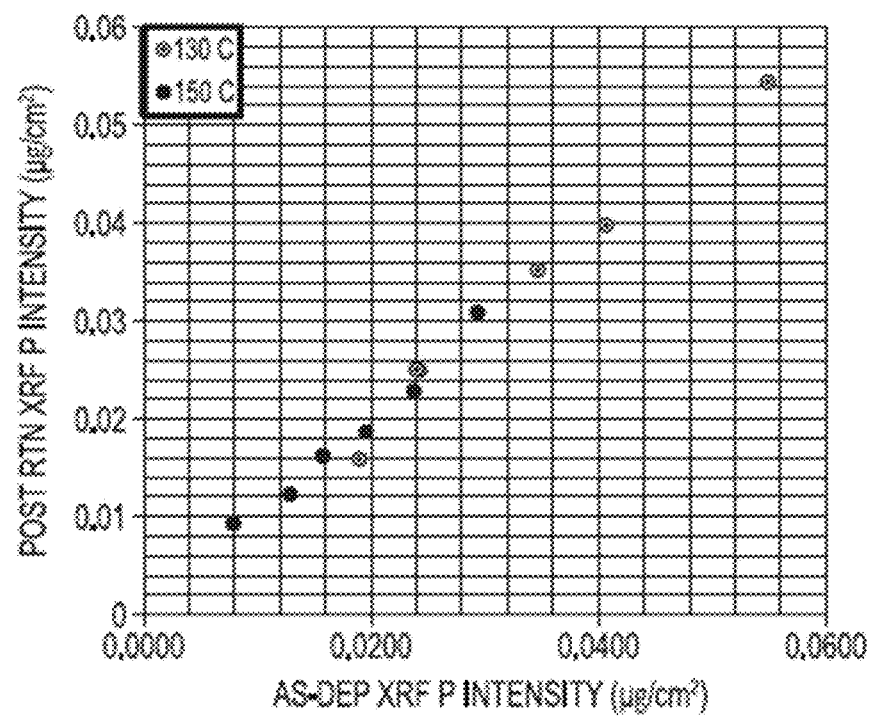

FIG. 37 is a graph of post-RTN 400° C. annealing phosphorus intensity, in micrograms/square centimeter, for P-doped cobalt films in which phosphorus was doped from a 5% trimethyl phosphorus doping composition (TMP+carrier gas), shown as a function of as-deposited XRF phosphorus intensity, in micrograms/square centimeter, for P-doped cobalt films deposited at 130° C. (lighter data points) and at 150° C. (darker data points). The data show that 400° C. RTN annealing does not reduce the concentration of the phosphorus dopant.

Figure 38:
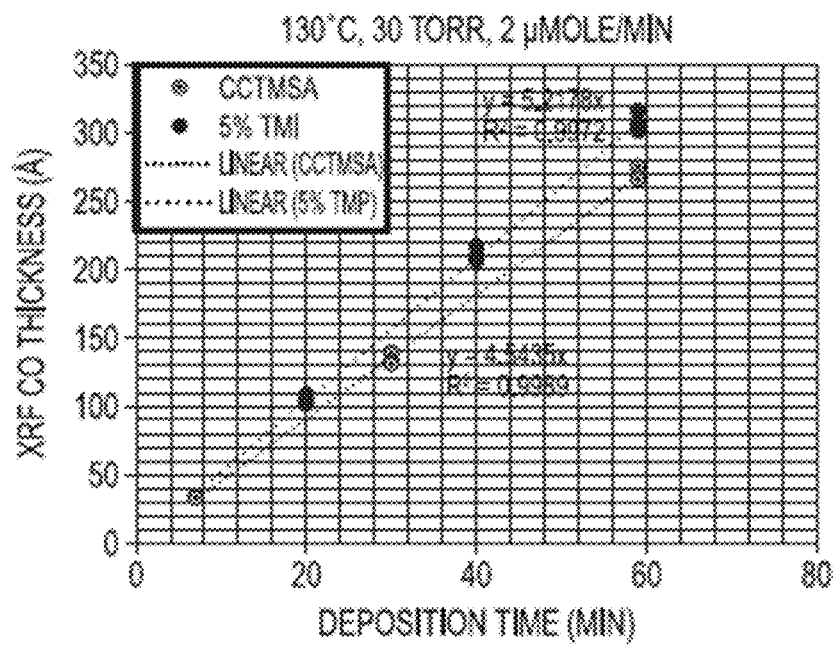

FIG. 38 is a graph of XRF cobalt thickness, in Ångströms, as a function of deposition time, in minutes, for phosphorus-doped cobalt film (darker data points) and for non-doped cobalt film (lighter data points), in which the cobalt film was deposited on thermal oxide at temperature of 130° C. and pressure of 30 torr, wherein the P-doped film was formed with a doping composition delivery rate of 2 µmole/min (5% TMP composition (TMP+carrier gas)), resulting in approximately 0.4 at % phosphorus in the film.

Figure 39:
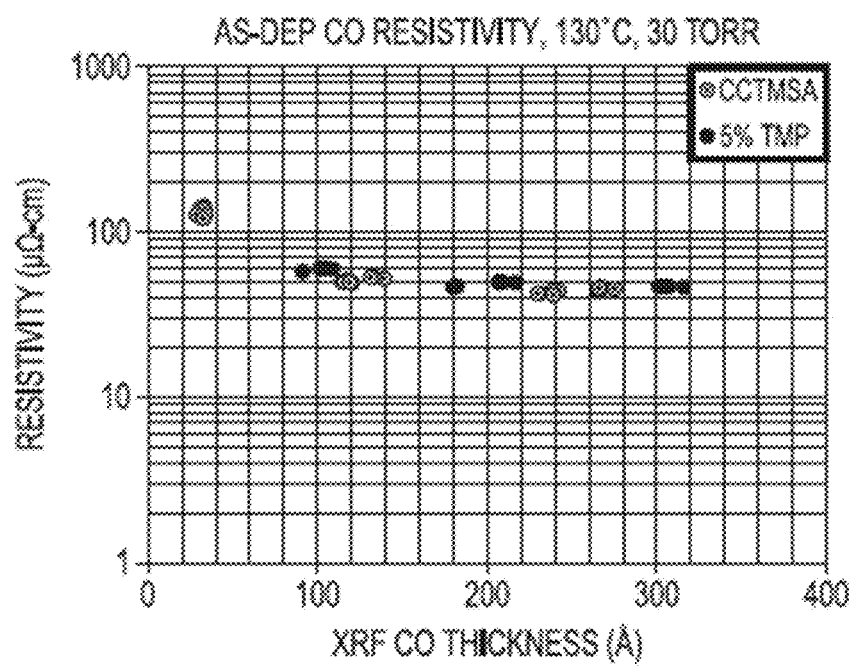

FIG. 39 is a graph of resistivity, in µΩ-cm, as a function of XRF cobalt film thickness, in Ångströms, for phosphorus-doped cobalt film (darker data points) and for non-doped cobalt film (lighter data points), in which the cobalt film was deposited on thermal oxide at temperature of 130° C. and pressure of 30 torr, wherein the P-doped film was formed with a doping composition delivery rate of 2 µmole/min (5% TMP composition (TMP+carrier gas)), resulting in approximately 0.4 at % phosphorus in the film.

In the films for which data are shown in FIGS. 38 and 39, doping with 5% TMP resulted in an increase of 15% of the DR, but not in the resistivity of the as-deposited cobalt film.

Figure 40:
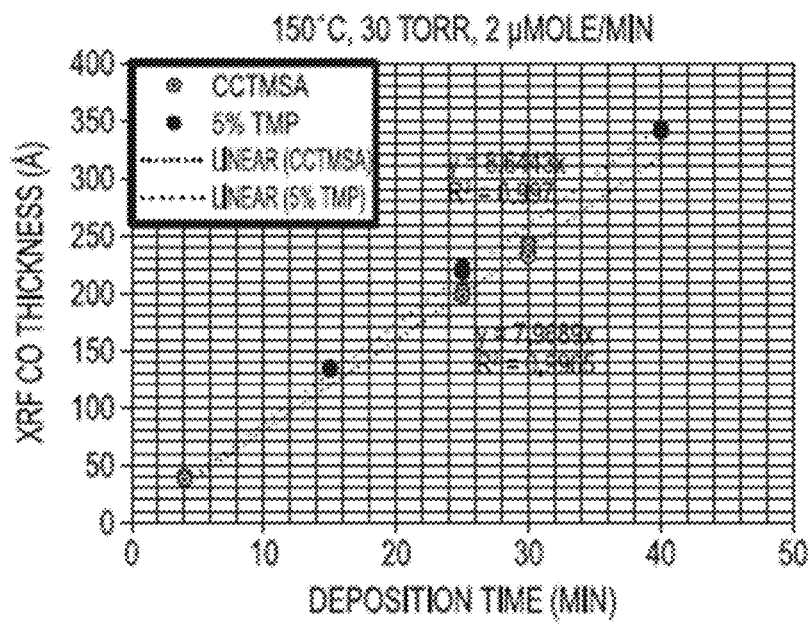

FIG. 40 is a graph of XRF cobalt thickness, in Ångströms, as a function of deposition time, in minutes, for phosphorus-doped cobalt film (darker data points) and for non-doped cobalt film (lighter data points), in which the cobalt film was deposited on thermal oxide at temperature of 150° C. and pressure of 30 torr, wherein the P-doped film was formed with a doping composition delivery rate of 2 µmole/min (5%

TMP composition (TMP+carrier gas)), resulting in approximately 0.2 at % phosphorus in the film.

Figure 41:
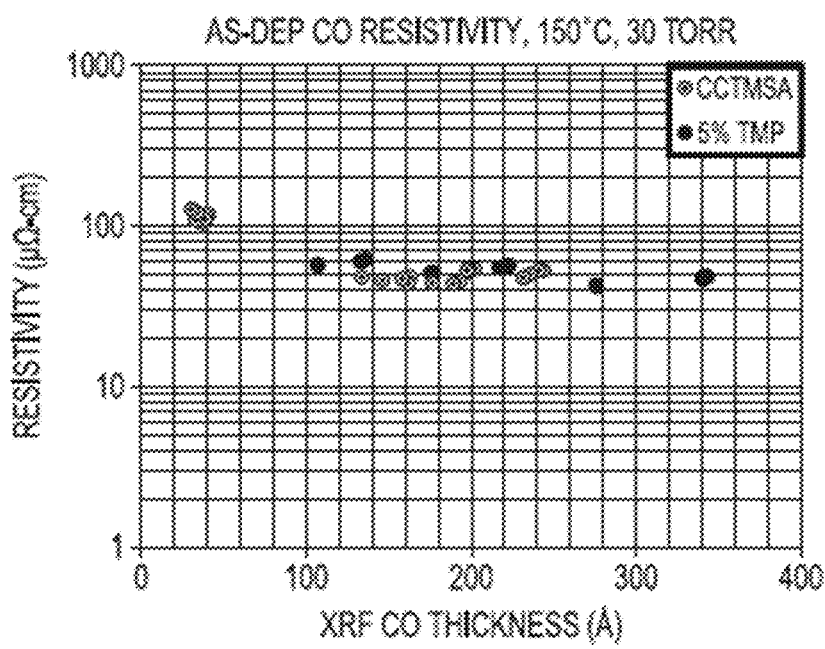

FIG. 41 is a graph of resistivity, in μΩ-cm, as a function of XRF cobalt film thickness, in Ångströms, for phosphorus-doped cobalt film (darker data points) and for non-doped cobalt film (lighter data points), in which the cobalt film was deposited on thermal oxide at temperature of 150° C. and pressure of 30 torr, wherein the P-doped film was formed with a doping composition delivery rate of 2 μmole/min (5% TMP composition (TMP+carrier gas)), resulting in approximately 0.2 at % phosphorus in the film.

In the films for which data are shown in FIGS. 40 and 41, doping with 5% TMP resulted in an increase of 8.5% of the DR, but not in the resistivity of the as-deposited cobalt film.

Figure 42:
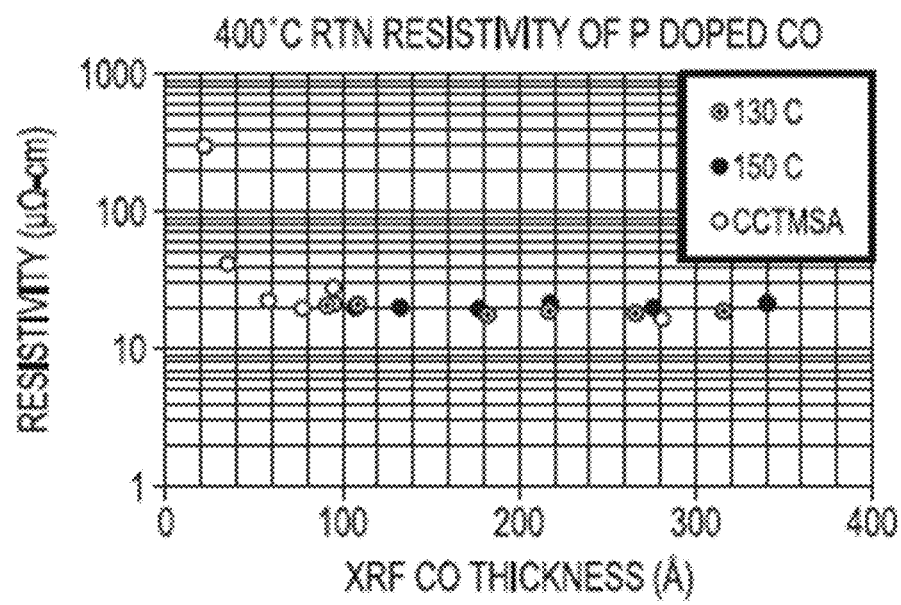

FIG. 42 is a graph of resistivity, in μΩ-cm, as a function of XRF cobalt film thickness, in Ångströms, for phosphorus-doped cobalt films deposited at 130° C. (lighter data points) and at 150° C. (darker data points) and for non-doped cobalt film (ring data points), in which the films had been subjected to 400° C. RTN annealing. Doping was carried out in the doped cobalt films with a 5% TMP dopant composition (TMP+carrier gas). The data show that phosphorus doping does not affect the annealed cobalt resistivity.

Figure 43:
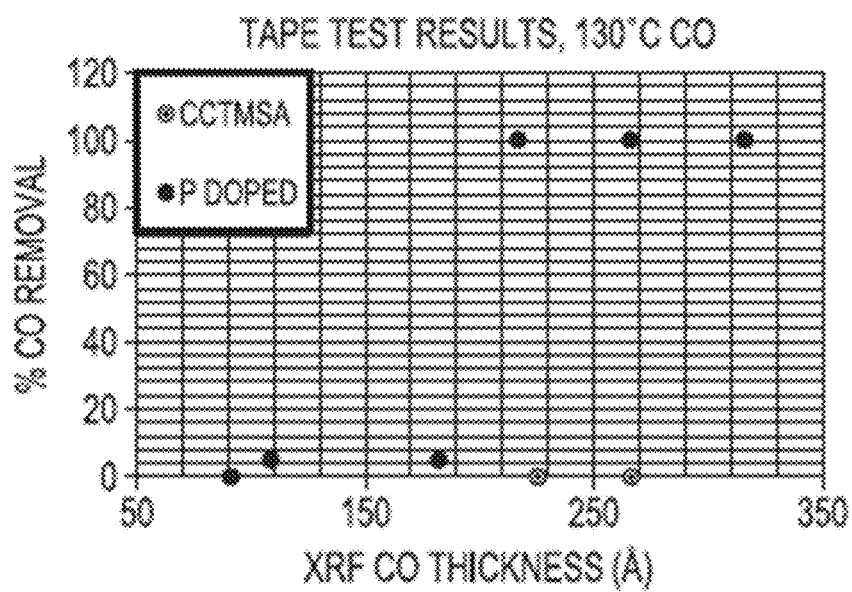
Figure 44:
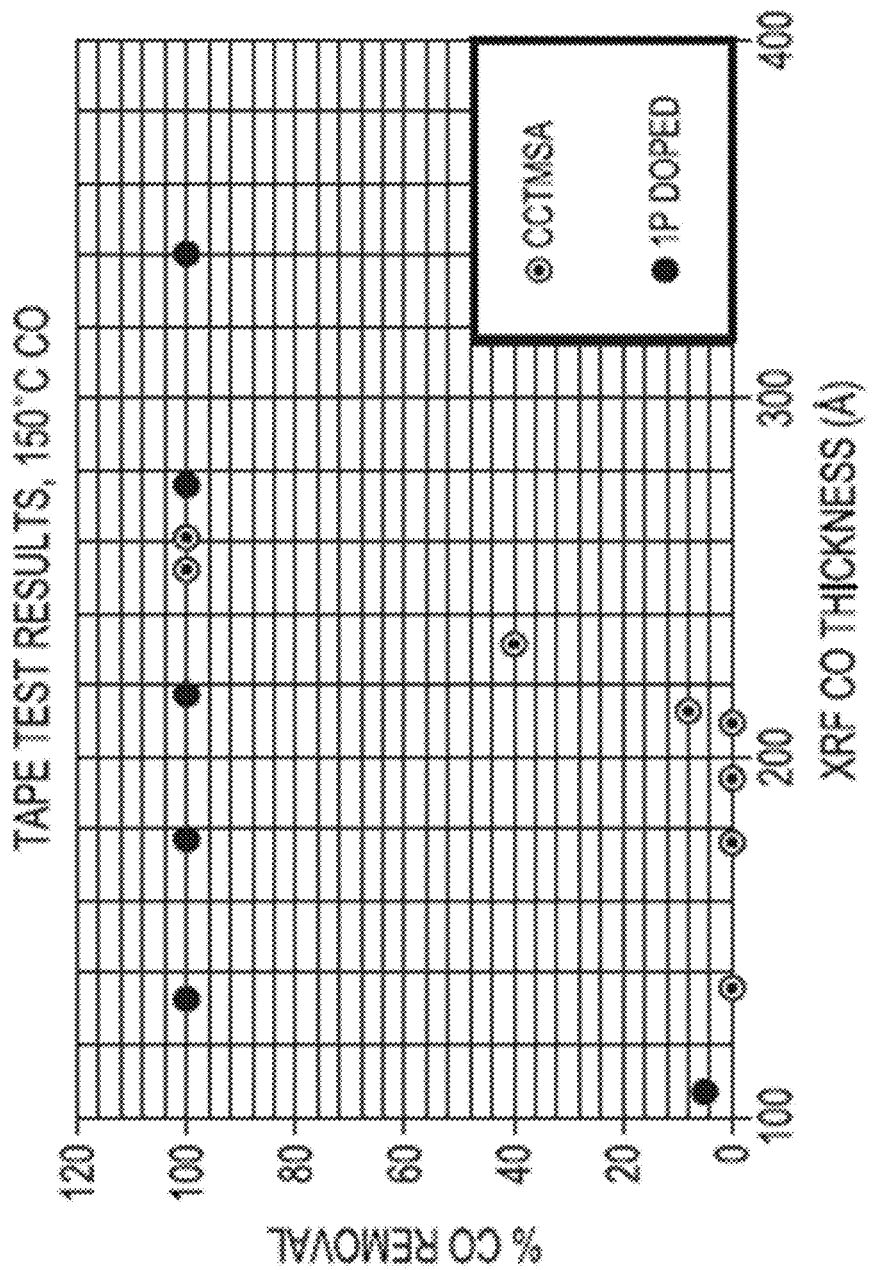

FIG. 43 and FIG. 44 show adhesion results for phosphorus-doped cobalt films, as determined by tape test.

FIG. 43 is a graph of percent cobalt removal, as a function of XRF cobalt film thickness, in Ångströms, for cobalt films deposited at 130° C., including phosphorus-doped films (darker data points) and non-doped cobalt films (lighter data points).

FIG. 44 is a graph of percent cobalt removal, as a function of XRF cobalt film thickness, in Ångströms, for cobalt films deposited at 150° C., including phosphorus-doped films (darker data points) and non-doped cobalt films (lighter data points).

The results in FIGS. 43 and 44 were believed to have reflected phosphorus contamination at the cobalt/SiO$_2$ substrate interface.

Figure 45:
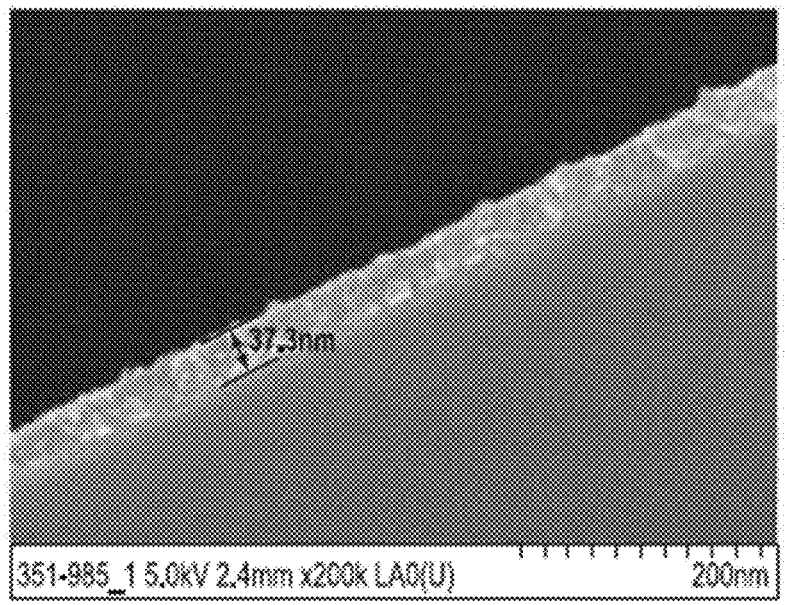
Figure 46:
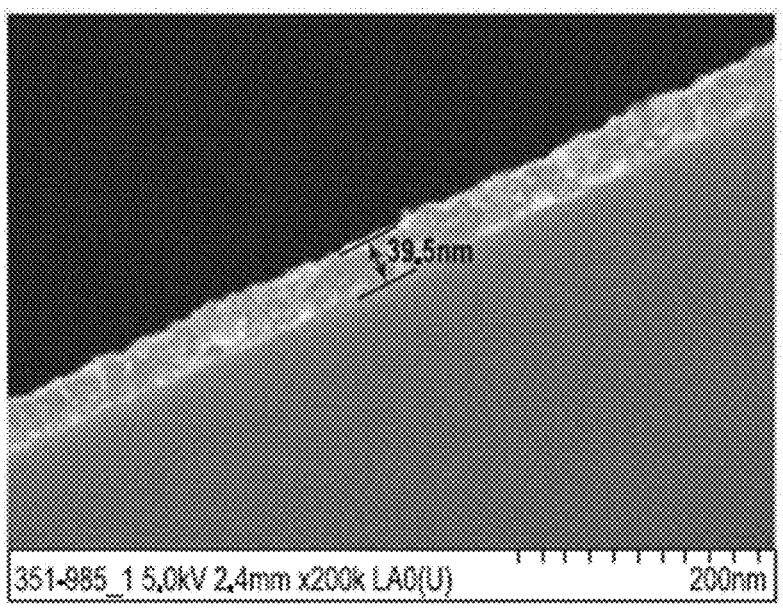
Figure 47:
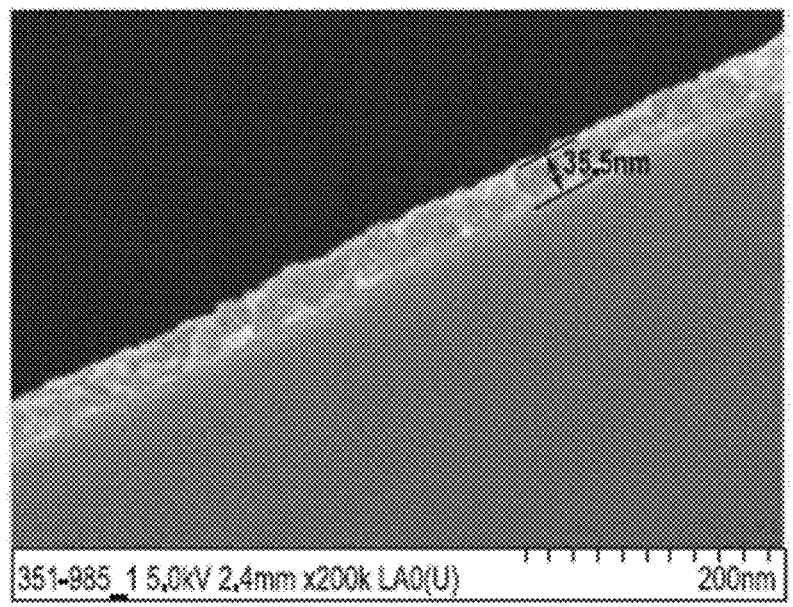

FIGS. 45-47 are SEM cross-section images of phosphorus-doped cobalt film deposited at 150° C. and 30 torr pressure, at cobalt thickness of 342.5 Å, wherein the film exhibited density of 91.3% of the as-deposited cobalt density.

Figure 48:
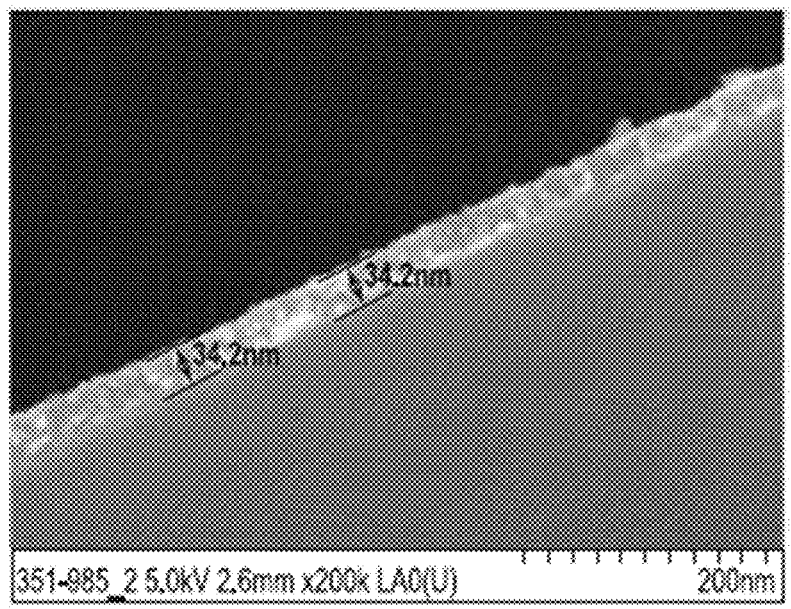
Figure 49:
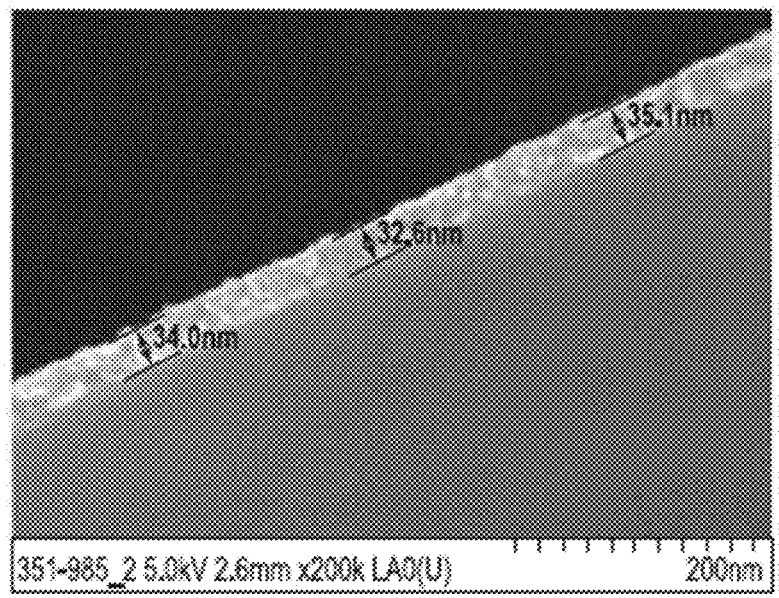

FIGS. 48-49 are SEM cross-section images of phosphorus-doped cobalt film deposited at 130° C. and 30 torr pressure, at cobalt thickness of 301.4 Å, wherein the film exhibited density of 88.6% of the as-deposited cobalt density.

Figure 50:
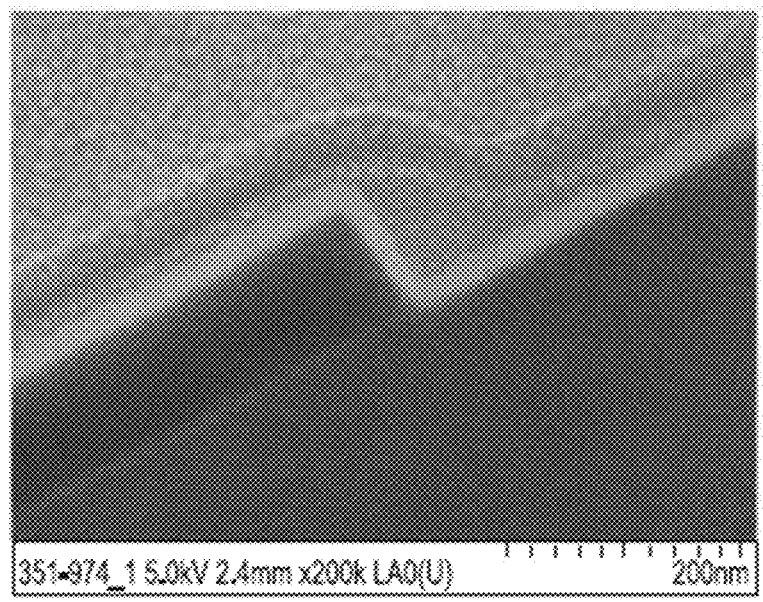
Figure 51:
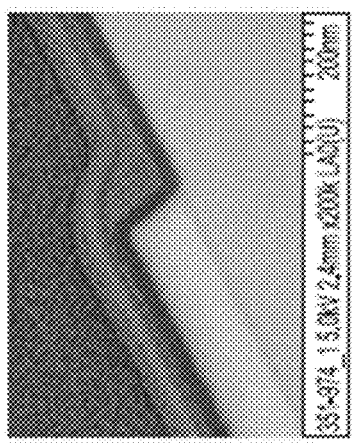

FIGS. 50 and 51 show focused ion beam (FIB)/SEM images of a 0.7 μm size trench/recess structure, for a cobalt coated SEM bar on which cobalt was deposited at 150° C. and 30 torr pressure, during a 30 minute deposition producing a 20 nm thick cobalt coating, which was annealed by 400° C. RTN annealing, and resulted in cobalt fracturing at the corners.

Figure 52:
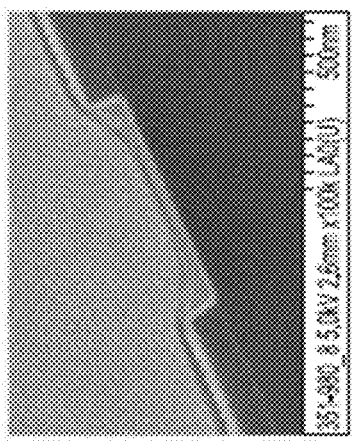

FIG. 52 is a SEM image of a cobalt coated SEM bar, cross-section, on which a phosphorus doped cobalt films deposited at temperature of 130° C. and pressure of 30 torr, utilizing a 5% TMP dopant composition (TMP+carrier gas), and resulting in a doped 17 nm cobalt film, which thereafter was subjected to 400° C. RTN annealing.

Figure 53:
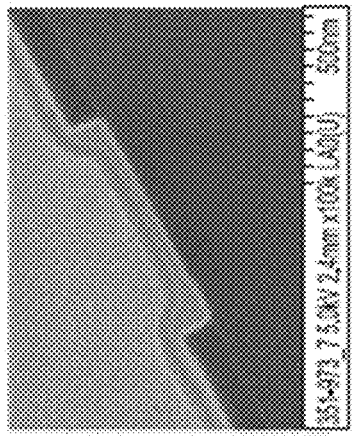

FIG. 53 is a SEM image of a cobalt coated SEM bar, cross-section, in which the cobalt film was deposited with TMI doping.

Based on the characterization of cobalt films including those of FIGS. 52 and 53, it was determined that less than 0.6 at % phosphorus doping does not reduce cobalt delamination.

Figure 54:
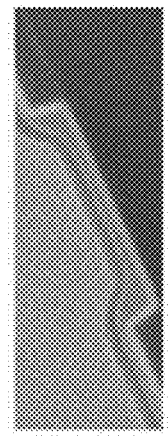
Figure 55:
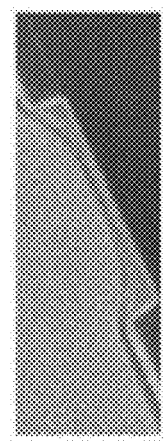
Figure 56:
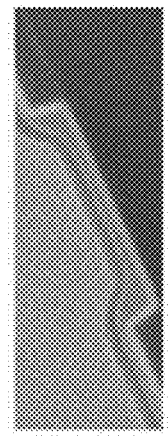
Figure 59:
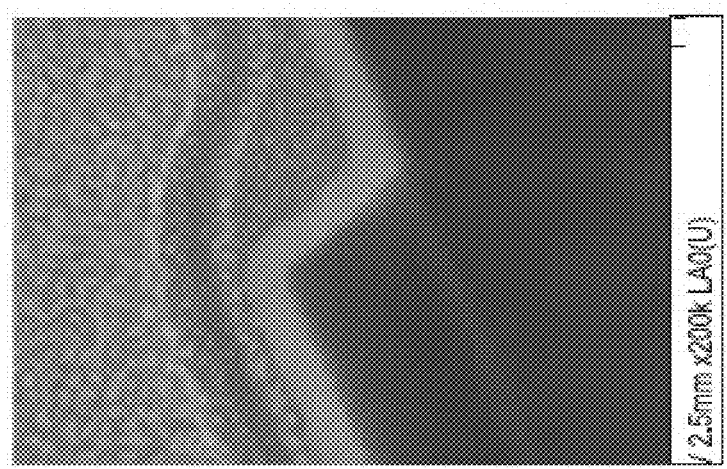
Figure 58:
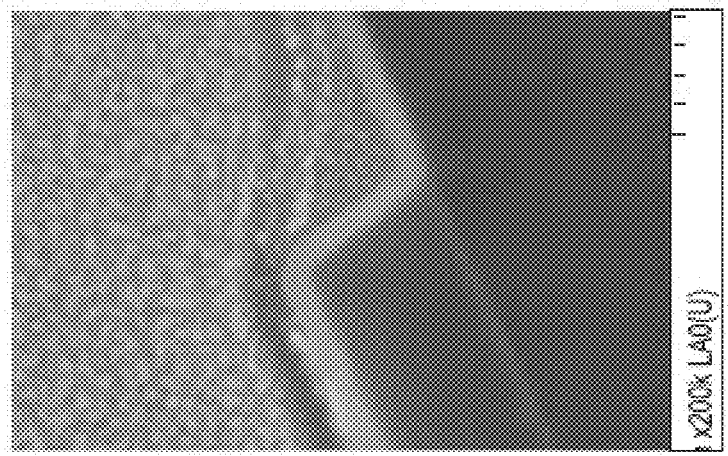
Figure 57:
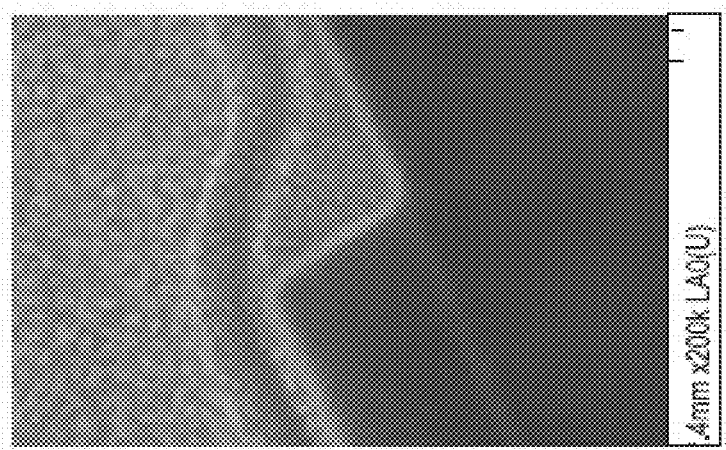

FIGS. 54, 55, and 56 are SEM images of a cobalt coated SEM bar, cross-section, for cobalt coatings of 9 nm thickness, 17 nm thickness, and 26 nm thickness, respectively, for cobalt films deposited at 130° C., pressure of 30 torr, utilizing 5% TMP dopant composition (TMP+carrier gas), and subjected to 400° C. RTN annealing. FIGS. 57, 58, and 59 are corresponding images of the phosphorus-doped cobalt films at 9 nm, 17 nm, and 26 nm cobalt film thickness, respectively.

Figure 60:
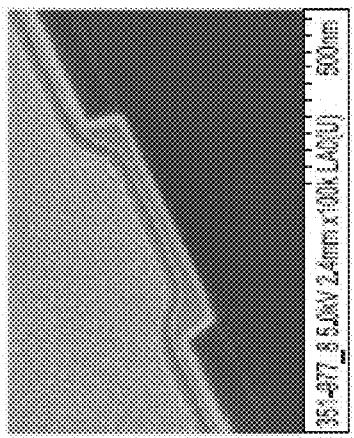

FIG. 60 is a SEM image of a cobalt coated SEM bar, cross-section, on which a phosphorus doped cobalt films deposited at temperature of 150° C. and pressure of 30 torr, utilizing a 5% TMP dopant composition (TMP+carrier gas), and resulting in a doped 27 nm cobalt film, which thereafter was subjected to 400° C. RTN annealing.

Figure 61:
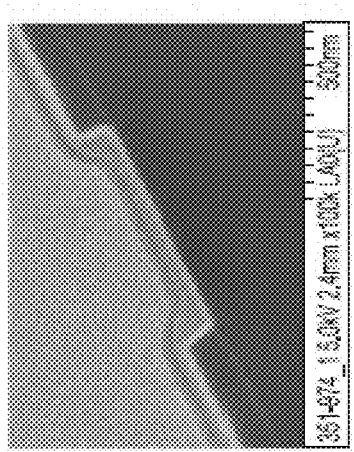

FIG. 61 is a SEM image of a cobalt coated SEM bar, cross-section, in which the cobalt film was deposited without phosphorus doping.

Figure 62:
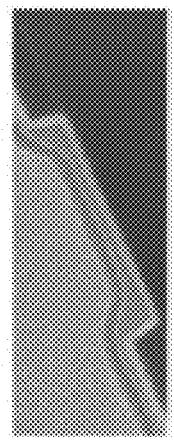
Figure 63:
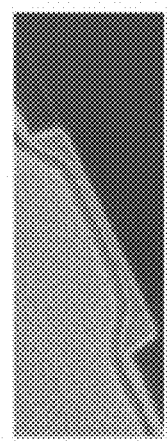
Figure 64:
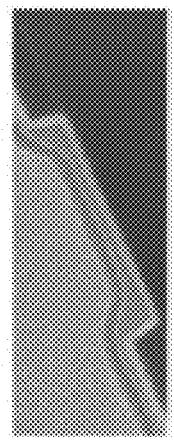
Figure 67:
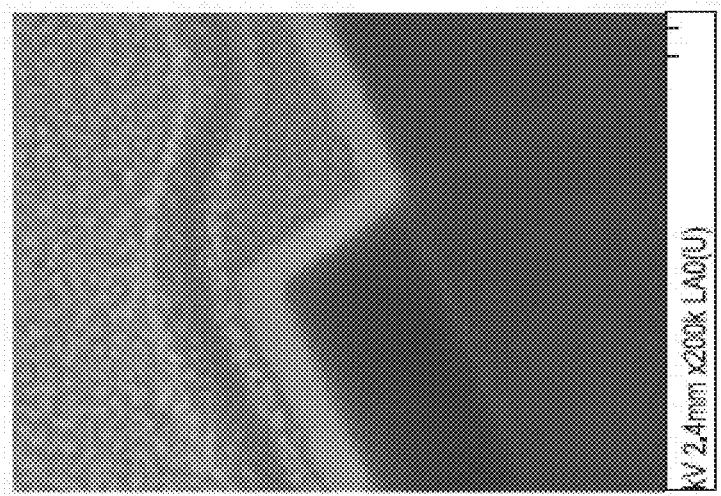
Figure 66:
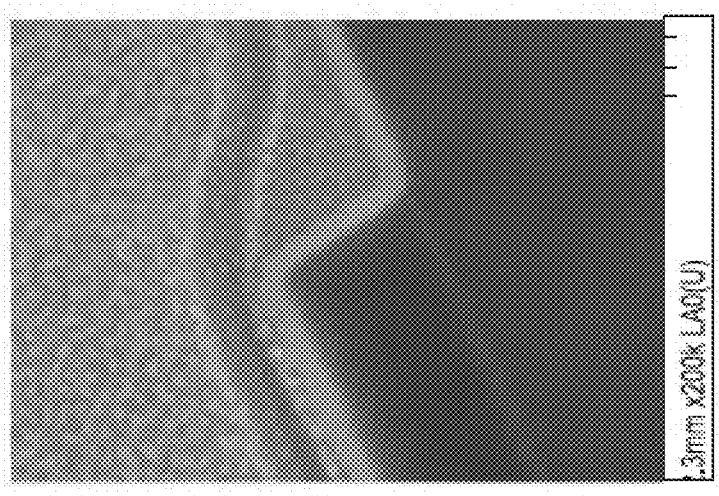
Figure 65:
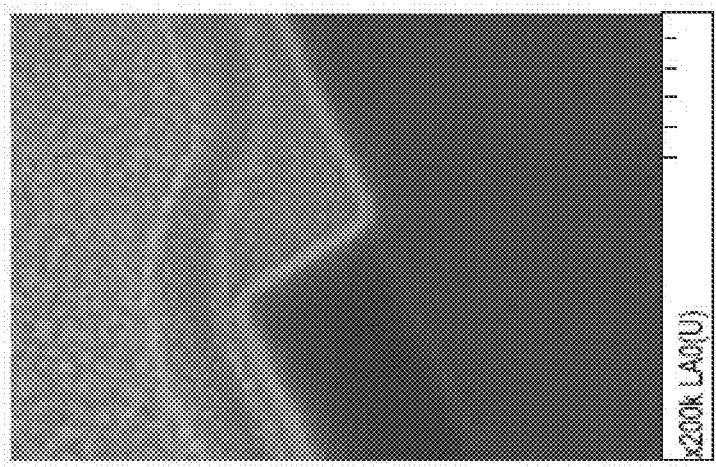

FIGS. 62, 63, and 64 are SEM images of a cobalt coated SEM bar, cross-section, for cobalt coatings of 10 nm thickness, 17 nm thickness, and 27 nm thickness, respectively, for cobalt films deposited at 150° C., pressure of 30 torr, utilizing 5% TMP dopant composition (TMP+carrier gas), and subjected to 400° C. RTN annealing. FIGS. 65, 66, and 67 are corresponding images of the phosphorus-doped cobalt films at 10 nm, 17 nm, and 27 nm cobalt film thickness, respectively.

Study 6—Cobalt Seed Layer Deposition

Figure 68:
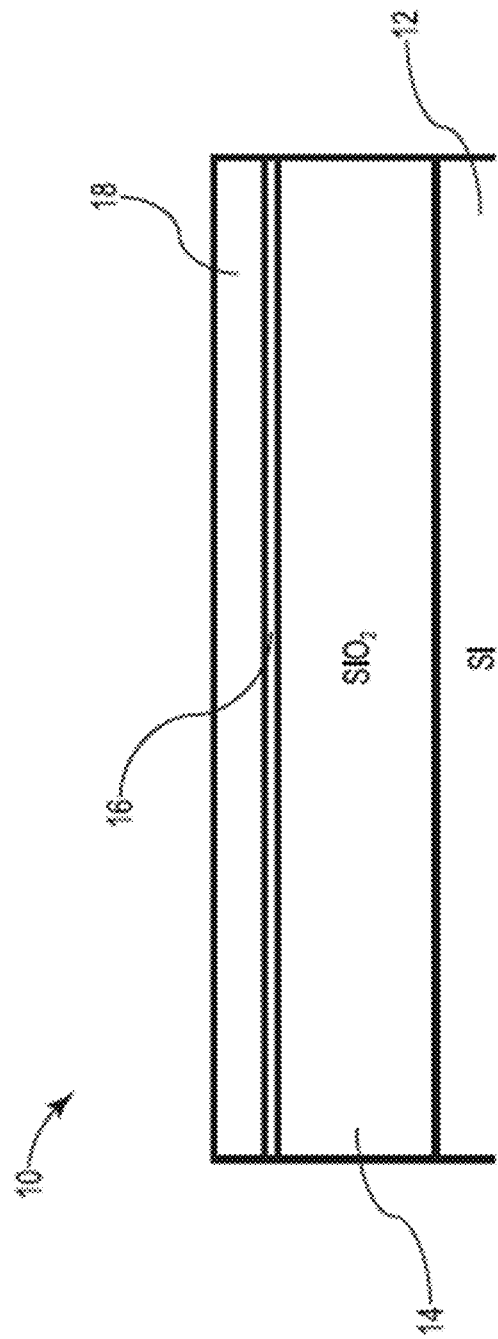
FIG. 68 is a schematic depiction of a semiconductor device structure used in Technical Study 6, in which the adhesion of a doped cobalt film is enhanced by a cobalt seed layer.

FIG. 68 is a schematic depiction of a semiconductor device structure 10, in which the adhesion of a doped cobalt film 18 on oxide (e.g., SiO$_2$) material 14 on a silicon substrate 12 is enhanced by provision of a cobalt seed layer 16 on the oxide material 14, as an initiation layer for subsequent deposition of the doped cobalt layer.

The cobalt seed layer serves to prevent dopant contamination at the cobalt/SiO$_2$ interface, such as may adversely affect the adhesive strength of the film on the substrate.

Study 7—Cobalt Seed Layer with Indium as Alloy Component

Figure 69:
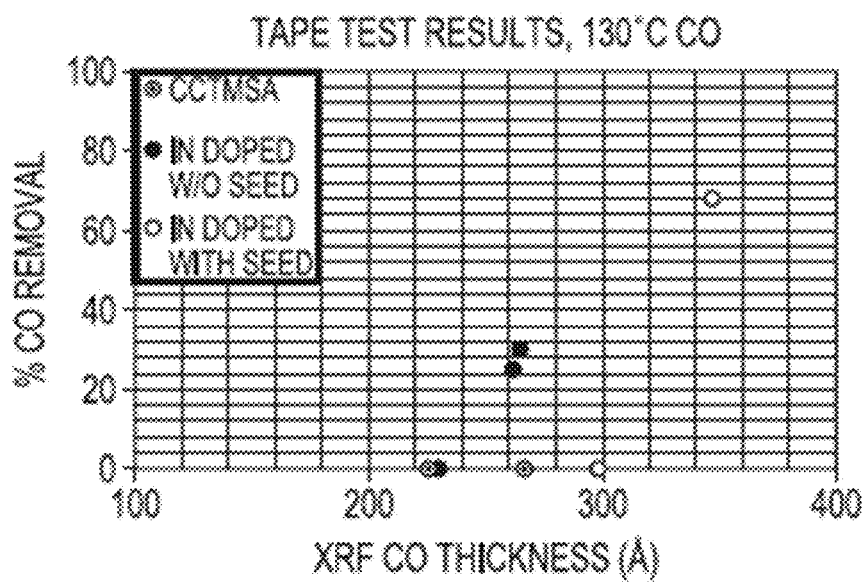
FIGS. 69 and 70 are graphs obtained in Technical Study 7 to illustrate the use of indium as an alloy component in vapor deposited cobalt compositions with a cobalt seed layer.
Figure 70:
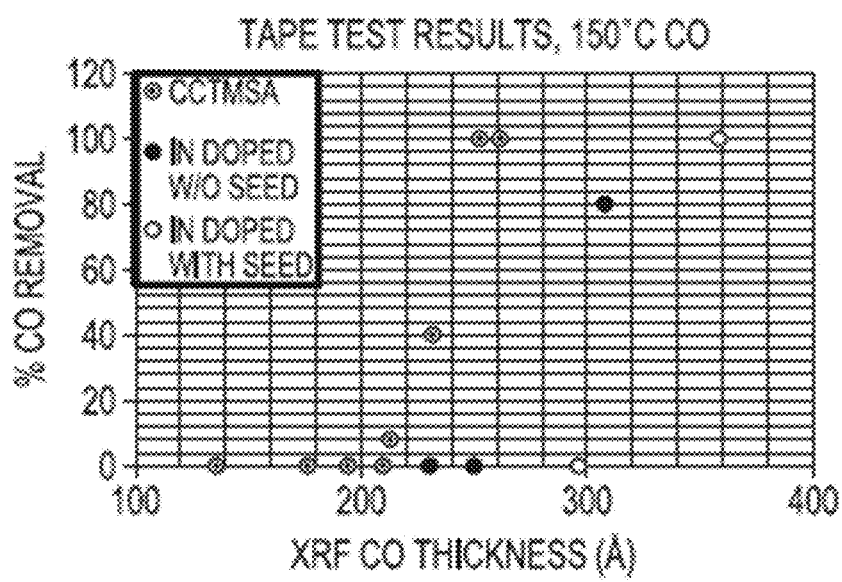

FIGS. 69 and 70 show adhesive strength tape test results for indium-doped cobalt films deposited on 4 nm thick cobalt seed layers that in turn are deposited on the thermal oxide. FIG. 69 is a graph of percent cobalt removal, as a function of XRF cobalt thickness, in Ångströms, wherein cobalt film was deposited at 130° C., for an undoped cobalt film (lighter points), for an indium doped cobalt film without a cobalt seed layer (darker data points), and for an indium doped cobalt film deposited on a cobalt seed layer on the substrate (ring data points). FIG. 70 is a graph of percent cobalt removal, as a function of XRF cobalt thickness, in Ångströms, wherein cobalt film was deposited at 150° C., for an undoped cobalt film (lighter data points), for an indium doped cobalt film without a cobalt seed layer (darker data points), and for an indium doped cobalt film deposited on a cobalt seed layer on the substrate (ring data points).

The data shown in FIGS. 69 and 70 show that the cobalt seed layer improved the adhesion of the indium-doped cobalt on the thermal oxide.

Study 8—Cobalt Seed Layer with Phosphorous as Alloy Component

Figure 71:
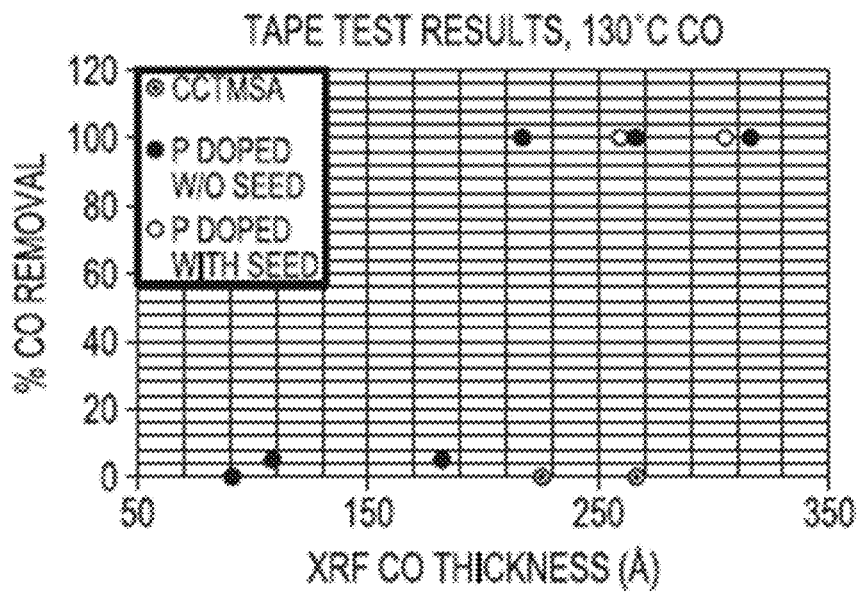
FIGS. 71 and 72 are graphs in Technical Study 8 to illustrate the use of phosphorous as an alloy component in vapor deposited cobalt compositions with a cobalt seed layer.
Figure 72:
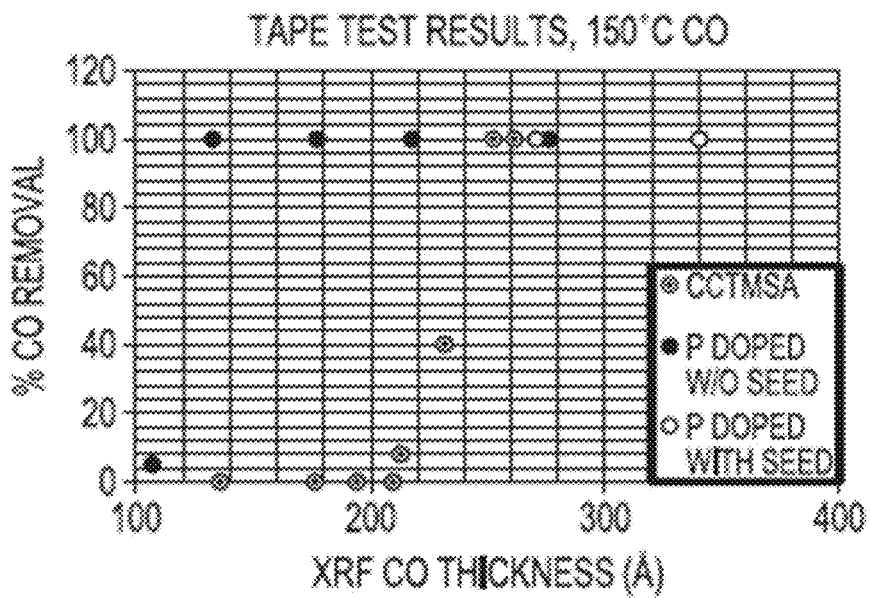

FIGS. 71 and 72 show adhesive strength tape test results for phosphorus-doped cobalt films deposited on 4 nm thick cobalt seed layers that in turn are deposited on the thermal oxide. FIG. 71 is a graph of percent cobalt removal, as a function of XRF cobalt thickness, in Ångströms, wherein cobalt film was deposited at 130° C., for an undoped cobalt film (lighter data points), for a phosphorus-doped cobalt film without a cobalt seed layer (darker data points), and for a phosphorus-doped cobalt film deposited on a cobalt seed layer on the substrate (ring data points). FIG. 72 is a graph of percent cobalt removal, as a function of XRF cobalt thickness, in Ångströms, wherein cobalt film was deposited at 150° C., for an undoped cobalt film (lighter data points), for a phosphorus-doped cobalt film without a cobalt seed layer (darker data points), and for a phosphorus-doped cobalt film deposited on a cobalt seed layer on the substrate (ring data points).

The data shown in FIGS. 71 and 72 did not evidence the improvement in adhesion of the phosphorus-doped cobalt film that was observed for the indium-doped cobalt film when a cobalt seed layer was employed prior to deposition of the indium-doped cobalt film.

Study 9—Boron as Alloy Component, Optionally with Cobalt Seed Layer

Boron-doped cobalt films formed by vapor deposition using CCTMSA as the cobalt precursor for such vapor deposition were assessed for adhesion characteristics. The boron doping of the cobalt film was carried out using 5% triethyl borane (TEB), at delivery rate of 2 µmole/minute of CCTMSA and 0.1 µmole/minute of TEB.

Figure 73:
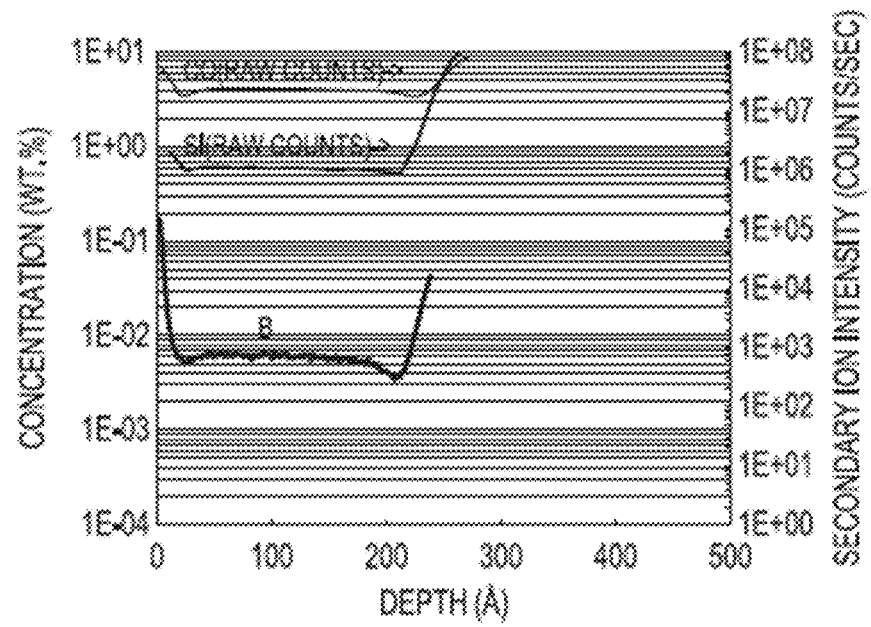

FIG. 73 is a graph of concentration, weight percent, and secondary ion intensity (counts/second), as a function of depth, in Ångströms, for a deposited cobalt film formed using CCTMSA and TEB, at temperature of 130° C. The respective profiles for cobalt, silicon, and boron are shown for the film, which contained 0.031 at % boron.

Figure 74:
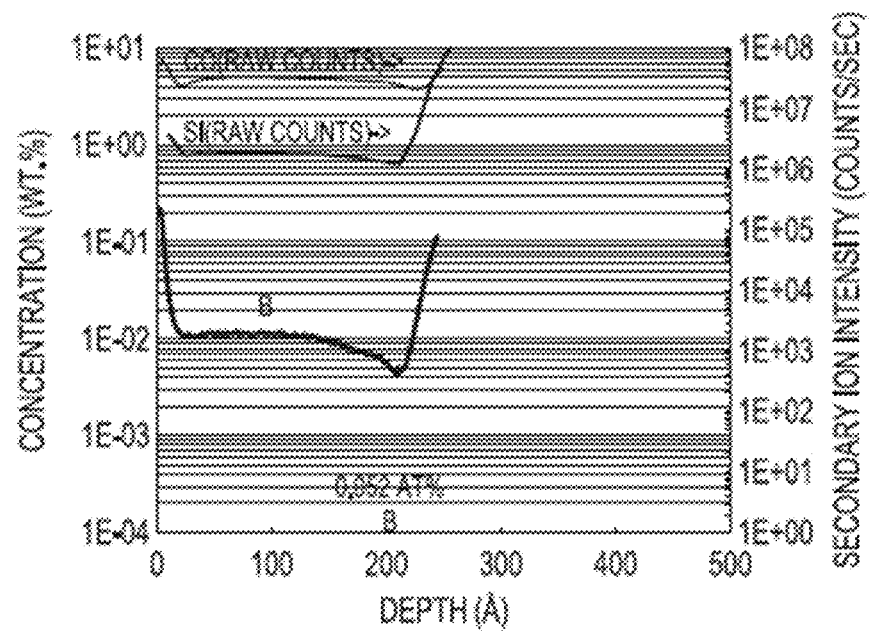

FIG. 74 is a graph of concentration, weight percent, and secondary ion intensity (counts/second), as a function of depth, in Ångströms, for a deposited cobalt film formed using CCTMSA and TEB, at temperature of 150° C. The respective profiles for cobalt, silicon, and boron are shown for the film, which contained 0.052 at % boron.

Figure 75:
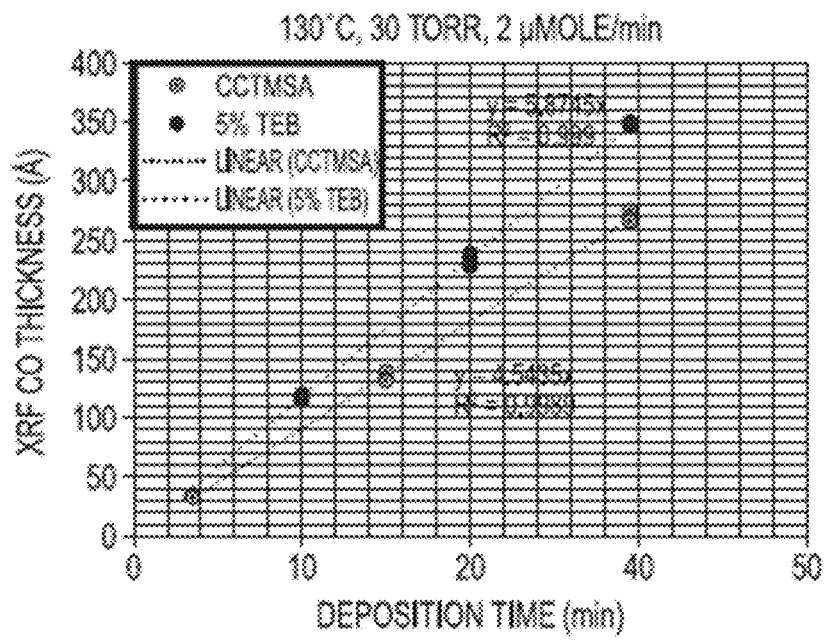

FIG. 75 is a graph of XRF cobalt thickness, in Ångströms, as a function of deposition time, in minutes, for a boron-doped cobalt film deposited on thermal oxide using CCTMSA and TEB, at temperature of 130° C., pressure of 30 torr, and delivery rate of 2 µmole/minute, showing the data for CCTMSA cobalt film (lighter data points) and for 5% TEB doping of cobalt film (darker data points).

Figure 76:
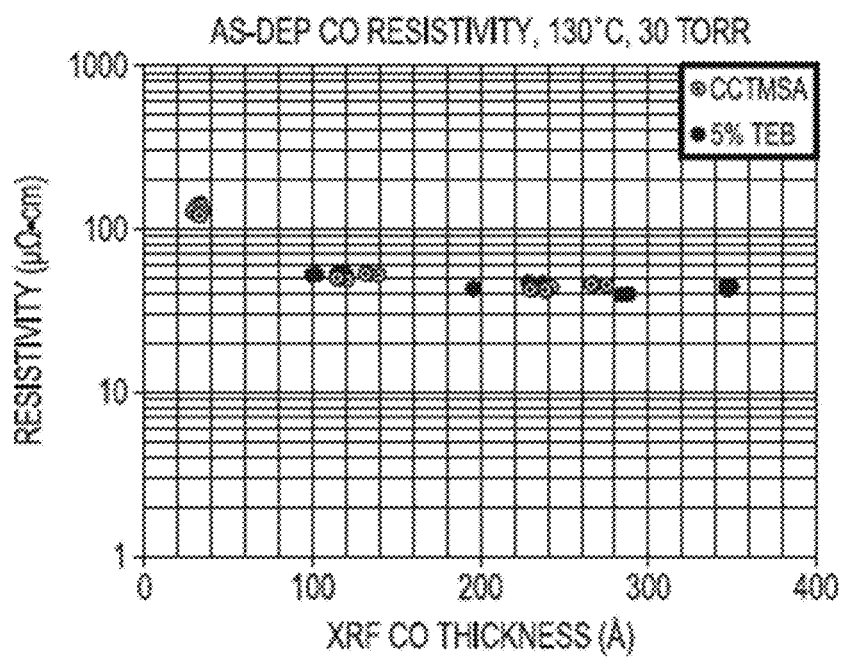

FIG. 76 is a graph of resistivity, in µΩ-cm, as a function of XRF cobalt thickness, in Ångströms, for CCTMSA cobalt film deposited at 130° C. (lighter data points) and for 5% TEB doped cobalt film deposited at 130° C. (darker data points).

The results show that doping of the cobalt film with 5% TEB increases the DR of cobalt film (~30%) at 130° C. deposition, but not the as-deposited resistivity.

Figure 77:
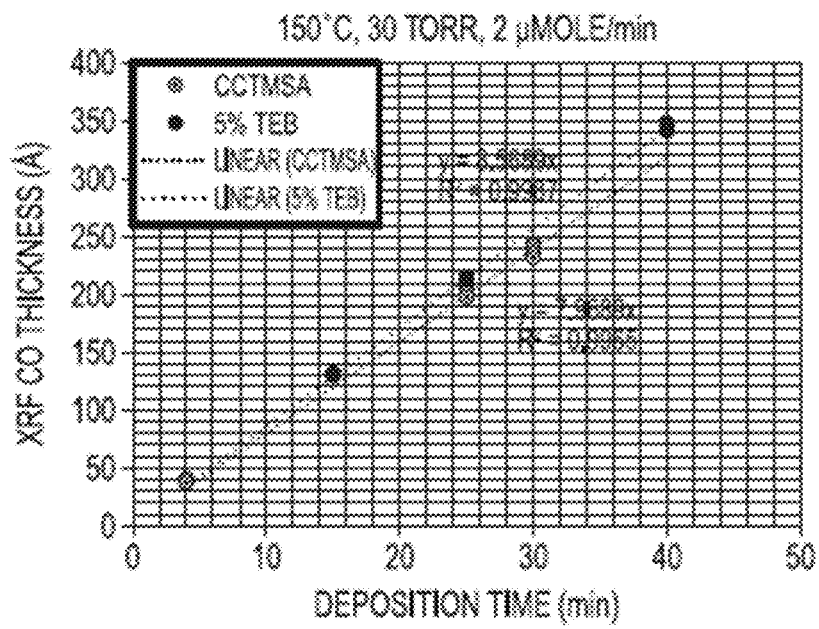

FIG. 77 is a graph of XRF cobalt thickness, in Ångströms, as a function of deposition time, in minutes, for a boron-doped cobalt film deposited on thermal oxide using CCTMSA and TEB, at temperature of 150° C., pressure of 30 torr, and delivery rate of 2 µmole/minute, showing the data for CCTMSA cobalt film (lighter data points) and for 5% TEB doping of cobalt film (darker data points).

Figure 78:
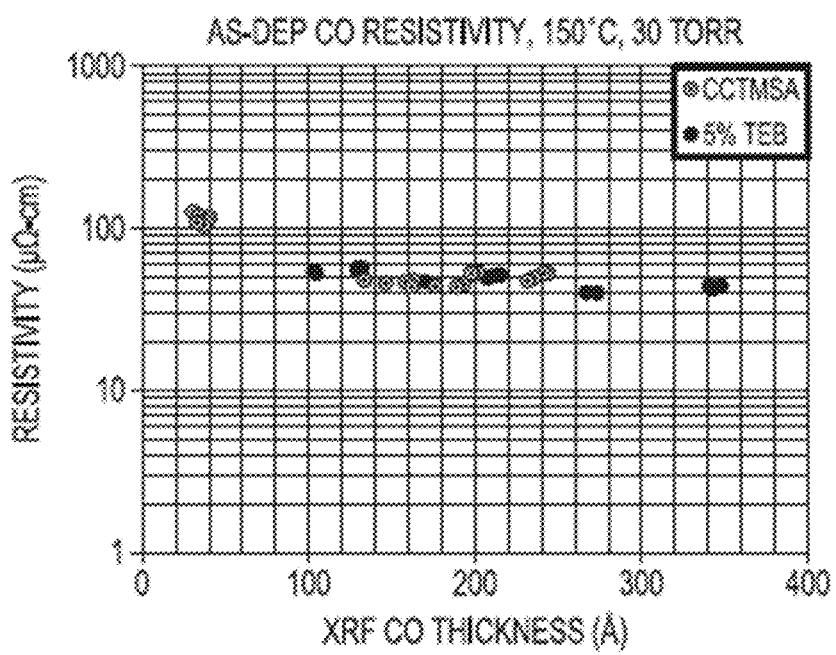

FIG. 78 is a graph of resistivity, in µΩ-cm, as a function of XRF cobalt thickness, in Ångströms, for CCTMSA cobalt film deposited at 150° C. (lighter data points) and for 5% TEB doped cobalt film deposited at 150° C. (darker data points).

The results show that doping of the cobalt film with 5% TEB slightly increases the DR of the cobalt film (~30%) at 150° C. deposition, but not the as-deposited resistivity.

Figure 79:
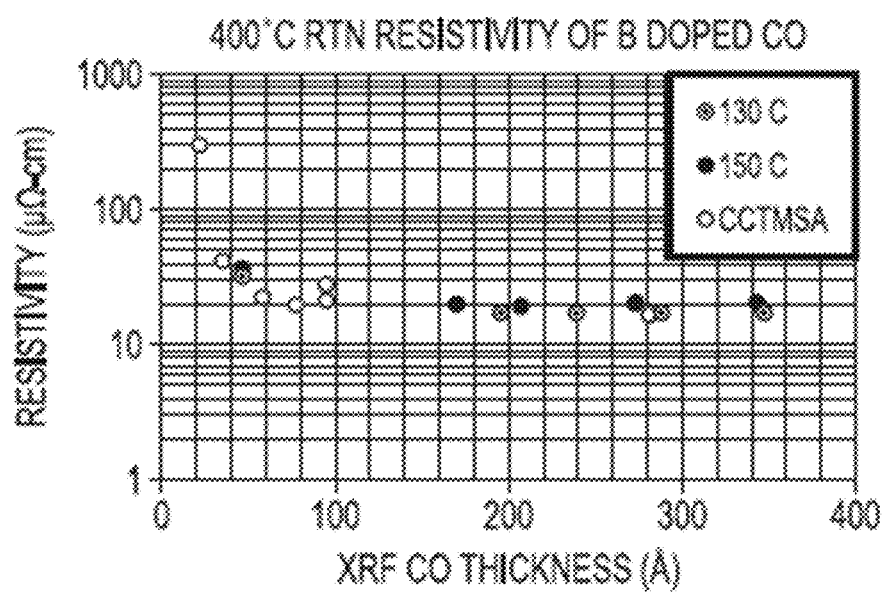

FIG. 79 is a graph of resistivity, in µΩ-cm, as a function of XRF cobalt thickness, in Ångströms, for CCTMSA deposited cobalt film (gray data points), for boron-doped cobalt film deposited at 130° C. (lighter data points) and for boron-doped cobalt film deposited at 150° C. (darker data points), in which the cobalt films were annealed at 400° C. by RTN annealing. The results show that boron doping does not significantly affect the annealed resistivity of the cobalt film.

Figure 80:
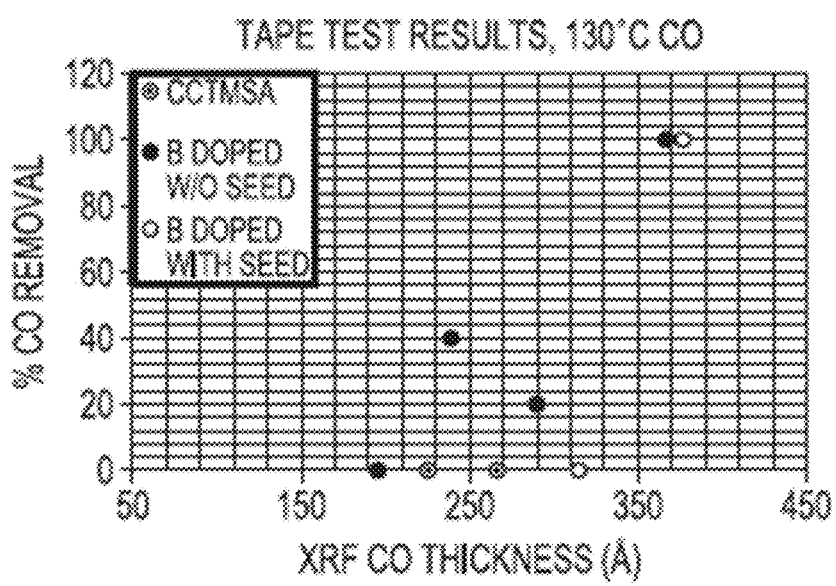

FIG. 80 is a graph of percent cobalt removal, as a function of XRF cobalt film thickness, in Ångströms, for CCTMSA deposited cobalt film on a thermal oxide substrate (lighter data points), for boron-doped cobalt film deposited without a cobalt seed layer on the thermal oxide substrate (darker data points), and for boron-doped cobalt film deposited on a cobalt seed layer on the thermal oxide substrate (ring data points), wherein all cobalt films were deposited at 130° C. The data for such adhesion tape test results show that a cobalt seed layer improved the adhesion of the boron-doped cobalt on the thermal oxide substrate.

Figure 81:
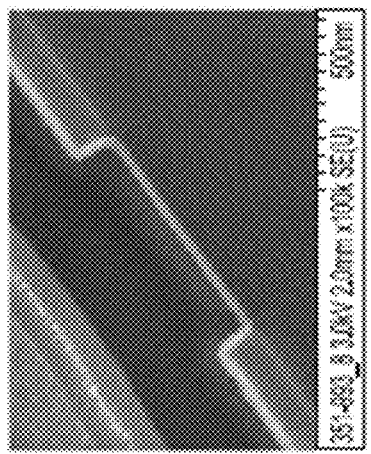

FIG. 81 is an SEM cross-section image of a cobalt film deposited at 130° C. and 30 torr pressure, using CCTMSA as the cobalt precursor.

Figure 82:
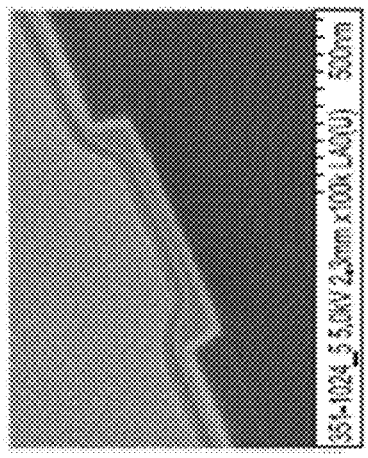

FIG. 82 is an SEM cross-section image of a boron-doped cobalt film deposited at 130° C. and 30 torr pressure, using CCTMSA as the cobalt precursor, evidencing that boron doping had no effect on adhesion of the cobalt film.

Figure 83:
Figure 85:
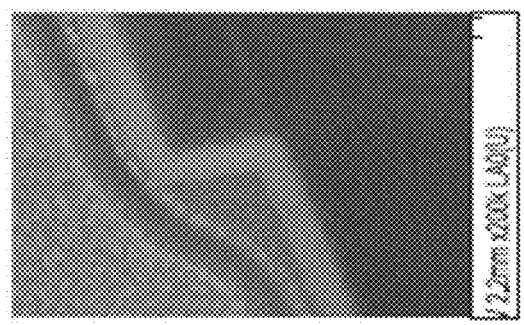
Figure 84:
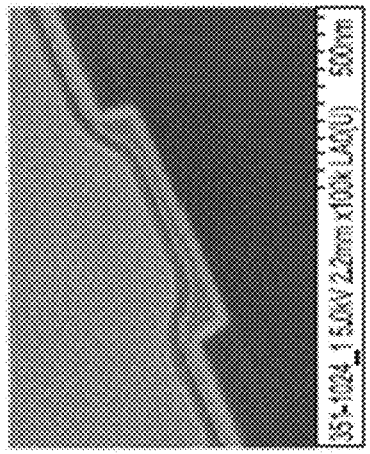

FIGS. 83-85 are SEM images of boron-doped cobalt film deposited at 130° C. on a 4 nm thick cobalt seed layer on thermal oxide, showing that the cobalt seed layer improved the adhesion of the boron-doped cobalt film on the thermal oxide.

Figure 86:
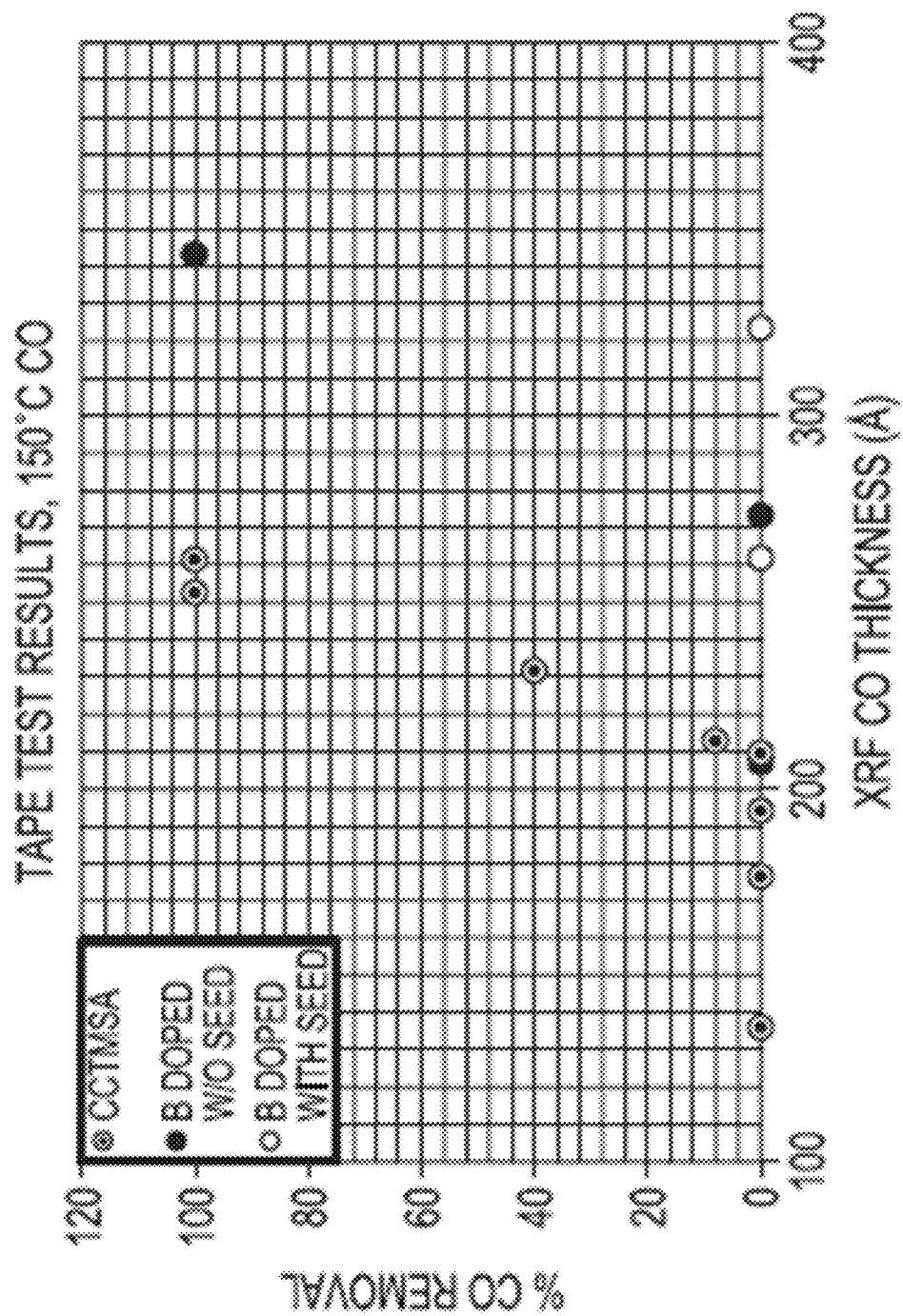

FIG. 86 is a graph of percent cobalt removal, as a function of XRF cobalt film thickness, in Ångströms, for CCTMSA deposited cobalt film on a thermal oxide substrate (lighter data points), for boron-doped cobalt film deposited without a cobalt seed layer on the thermal oxide substrate (darker data points), and for boron-doped cobalt film deposited on a 4 nm thick cobalt seed layer on the thermal oxide substrate (ring data points), wherein all cobalt films were deposited at 150° C. The data for such adhesion tape test results show that a cobalt seed layer improved the adhesion of the boron-doped cobalt on the thermal oxide substrate.

Figure 87:
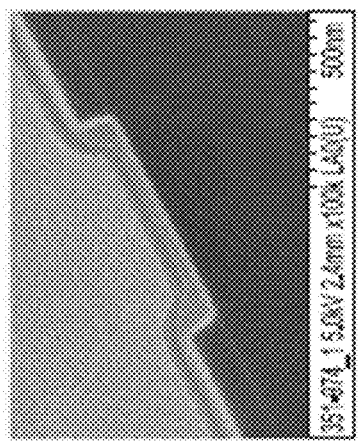

FIG. 87 is an SEM cross-section image of a cobalt film deposited at 150° C., using CCTMSA as the cobalt precursor.

Figure 88:
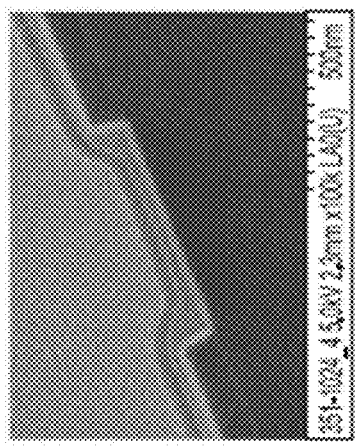

FIG. 88 is an SEM cross-section image of a boron-doped cobalt film deposited at 150° C., using CCTMSA as the cobalt precursor, evidencing that boron doping improved the adhesion of the cobalt film that was deposited at 150° C.

Figure 89:
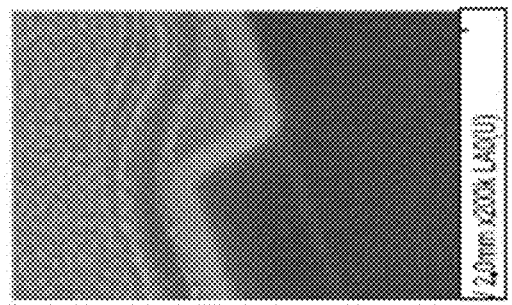
Figure 91:
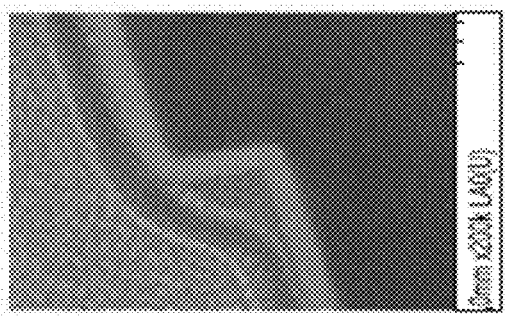
Figure 90:

FIGS. 89-91 are SEM images of boron-doped cobalt film deposited at 150° C. on a 4 nm thick cobalt seed layer on thermal oxide, showing that the cobalt seed layer improved the adhesion of the boron-doped cobalt film on the thermal oxide.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

The invention claimed is:

1. A vapor-deposited cobalt composition, comprising cobalt and one or more alloy component that is effective in combination with cobalt to enhance adhesion to a substrate when exposed on the substrate to variable temperature and/or delaminative force conditions, as compared to corresponding elemental cobalt, wherein the one or more alloy component comprises indium or boron at a concentration of from 0.025 to 0.15 at % based on atomic weight of the doped cobalt composition and wherein the cobalt is deposited from vapor of a cobalt precursor and the one or more alloy component is deposited from vapor of an alloy component precursor.

2. The deposited cobalt composition of claim 1, wherein the composition comprises one or more of a homogeneous blend of cobalt and the one or more alloy component, discrete layers of respective cobalt and one or more alloy component, and dispersed discrete regions of the one or more alloy component in a bulk volume of the cobalt.

3. The deposited cobalt composition of claim 1, wherein the one or more alloy component is present in, around, on, or under a bulk volume of the cobalt.

4. The deposited cobalt composition of claim 1, wherein the composition is vapor deposited at a temperature of at least 120° C.

5. The deposited cobalt composition of claim 1, wherein the cobalt is deposited from vapor of a cobalt precursor selected from the group consisting of CCTBA, CCTMSA, and CCBTMSA.

6. The deposited cobalt composition of claim 1, wherein the cobalt is deposited from vapor of a cobalt precursor selected from the group consisting of:

(A) cobalt hexacarbonyl complex precursors of the formula:

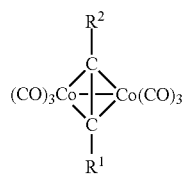

wherein $R^1$ and $R^2$ may be the same as or different from one another, and each is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes, and wherein $R^1$ and $R^2$ are not both H;

(B) cobalt silylamide precursors;

(C) cobalt (0) carbonyl complex precursors including at least one ligand selected from the group consisting of alkenes, allenes, alkynes, and Lewis base ligands;

(D) cobalt hexacarbonyl dinitrile precursors of the formula [RN≡C—Co(CO)$_3$]$_2$, wherein R is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes; and (E) cobalt dicarbonyl nitrile precursors of the formula (CO)$_2$CoN≡O(C≡NR) wherein R is independently selected from among H, $C_1$-$C_4$ alkyl, silyl-substituted alkyl, dialkylamide, ethylene, acetylene, alkynes, substituted alkenes, $C_1$-$C_4$ substituted alkynes, silylalkyl, silylamide, trimethylsilyl, trialkylsilyl-substituted alkynes, and trialkylsilylamido-substituted alkynes.

7. The deposited cobalt composition of claim 1, wherein the alloy component is deposited from vapor of an alloy component precursor selected from trimethyl indium.

8. The deposited cobalt composition of claim 1, deposited on a cobalt seed film.

9. The deposited cobalt composition of claim 8, wherein the cobalt seed film has a thickness in a range of from 2 to 10 nm.

10. The deposited cobalt composition of claim 8, wherein the cobalt seed film is deposited on an oxide material comprising silicon dioxide.

11. The deposited cobalt composition of claim 1, deposited in a trench or via of a semiconductor device substrate or semiconductor device precursor structure substrate.

12. The deposited cobalt composition of claim 1, wherein the cobalt is deposited from vapor of a cobalt precursor selected from the group consisting of CCTBA, CCTMSA, and CCBTMSA, and wherein the one or more alloy component is selected from the group consisting of indium, and boron.

13. A semiconductor device or device precursor structure, a flat-panel display, or a solar panel, comprising metallization comprising a deposited cobalt composition according to claim 1.

14. The semiconductor device or device precursor structure, flat-panel display, or solar panel according to claim 13, wherein the cobalt is deposited from vapor of a cobalt precursor selected from the group consisting of CCTBA, CCTMSA, and CCBTMSA, and wherein the one or more alloy component is selected from the group consisting of indium, and boron.

15. A method of enhancing adhesion of vapor deposited cobalt on a substrate, said method comprising vapor-depositing on the substrate a cobalt composition comprising cobalt and one or more alloy component that is effective in combination with cobalt to enhance adhesion to a substrate when exposed on the substrate to variable temperature and/or delaminative force conditions, as compared to corresponding elemental cobalt, wherein the one or more alloy component comprises indium or boron at a concentration of from 0.025 to 0.15 at % based on atomic weight of the doped cobalt composition and wherein the cobalt is deposited from vapor of a cobalt precursor and the one or more alloy component is deposited from vapor of an alloy component precursor.

16. The method of claim 15, wherein the substrate is exposed to variable temperature and/or delaminative force conditions after cobalt and the one or more alloy component are deposited thereon.

17. The method of claim 16, wherein the variable temperature conditions comprise thermal cycling of the vapor deposited cobalt composition, and the delaminative force conditions comprise chemical mechanical planarization of the deposited cobalt composition.

* * * * *